(12) United States Patent
Ringer et al.

(10) Patent No.: US 9,238,964 B2
(45) Date of Patent: Jan. 19, 2016

(54) REAL TIME DATA COMPRESSION AND TRANSMISSION

(75) Inventors: Maurice Ringer, Cambridge (GB); Walter Aldred, Thriplow (GB); Jonathan Dunlop, Cambridge (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 509 days.

(21) Appl. No.: 13/639,960

(22) PCT Filed: Apr. 8, 2011

(86) PCT No.: PCT/IB2011/000762
§ 371 (c)(1),
(2), (4) Date: Feb. 11, 2013

(87) PCT Pub. No.: WO2011/124978
PCT Pub. Date: Oct. 13, 2011

(65) Prior Publication Data
US 2013/0135114 A1    May 30, 2013

(30) Foreign Application Priority Data

Apr. 9, 2010    (GB) .................................. 1005913.7

(51) Int. Cl.
*E21B 47/12*    (2012.01)
*H04Q 9/00*    (2006.01)

(52) U.S. Cl.
CPC  *E21B 47/12* (2013.01); *H04Q 9/00* (2013.01); *H04Q 2209/823* (2013.01)

(58) Field of Classification Search
CPC ....... E21B 47/12; H04Q 9/00; G06F 11/3065; G06F 15/8007; G06F 17/00; G06F 17/18; G01V 3/38; H03M 7/30
USPC ........... 702/6, 14; 711/100; 707/693; 341/87
See application file for complete search history.

(56) References Cited

U.S. PATENT DOCUMENTS 4,920,489 A  *  4/1990 Hubelbank et al. ........... 600/519
4,942,528 A       7/1990 Kerzner
(Continued)

OTHER PUBLICATIONS

International Search Report of PCT Application No. PCT/IB2011/000762 dated Nov. 24, 2011: pp. 1-3.
(Continued)

*Primary Examiner* — Albert Wong

(57) ABSTRACT

Systems, methods, and devices are provided for compressing a variety of signals, such as measured signals from a hydrocarbon operation, that may be stored and/or transmitted in compressed form. Segmentation tools and techniques are used to compress the signals. Segmentation techniques include breaking a signal into segments and representing the data samples of the signal as segment boundary points, which may reflect where changes occur in the signal, and segment parameters, which may be utilized to model the segmented data. Embodiments can be used in real-time or in batch modes. New data samples can influence previous segment boundary points and/or segment parameters in some cases. Systems may modify what has already been stored or displayed as a result in revising segmentation information based on analysis utilizing the new data samples. Embodiments may utilize different Bayesian analysis techniques including the use of prior probability distributions and maximum a posteriori analyses.

37 Claims, 16 Drawing Sheets

(56) References Cited

U.S. PATENT DOCUMENTS

| | | |
|---|---|---|
| 5,586,200 A | 12/1996 | Devaney et al. |
| 5,963,508 A | 10/1999 | Withers |
| 6,125,203 A | 9/2000 | Keskes et al. |
| 2005/0222775 A1* | 10/2005 | Kisra et al. .............. 702/14 |
| 2009/0254281 A1 | 10/2009 | Hruska et al. |

OTHER PUBLICATIONS

Li et al., "Chapter 1.1: Image Segmentation and Compression," Image segmentation and compression using hidden Markov models, Norwell: Kluwer Academic Publishers, 2000: pp. 1-2.

Sivia, "Model selection," Data Analysis A Bayesian Tutorial, Oxford: Oxford University Press, 1996: pp. 81-86.

* cited by examiner

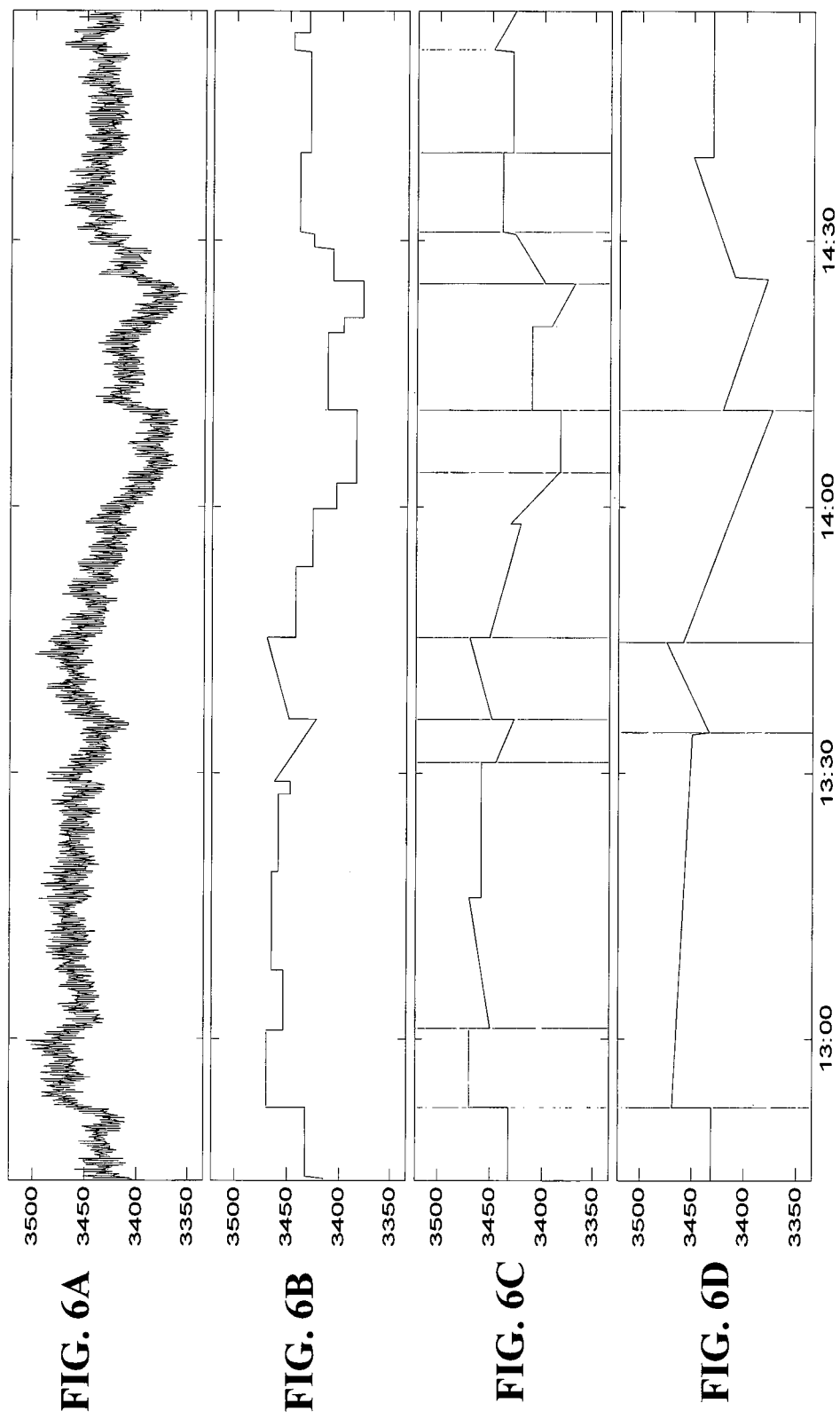

| Raw data: | $x_1\ x_2\ x_3\ x_4\ x_5\ ...$ |
|---|---|
| Compressed signal: | $s_1\ m_1\ c_1\ s_2\ m_2\ c_2\ ...$ |

FIG. 7A

| Raw data (channel 1) | $x_1\ x_2\ x_3\ x_4\ x_5\ ...$ |
|---|---|
| Raw data (channel 2) | $y_1\ y_2\ y_3\ y_4\ y_5\ ...$ |
| Compressed signal: | $s_1\ m_{1,1}\ c_{1,1}\ m_{1,2}\ c_{1,2}\ s_2\ m_{2,1}\ c_{2,1}\ m_{2,2}\ c_{2,2}\ ...$ |

FIG. 7B

| Raw data | $x_1\ x_2\ x_3\ x_4\ x_5\ ...$ |
|---|---|
| Compressed signal: | $s_1\ m_1\ c_1\ v_1\ s_2\ m_2\ c_2\ v_2\ ...$ |

FIG. 7C

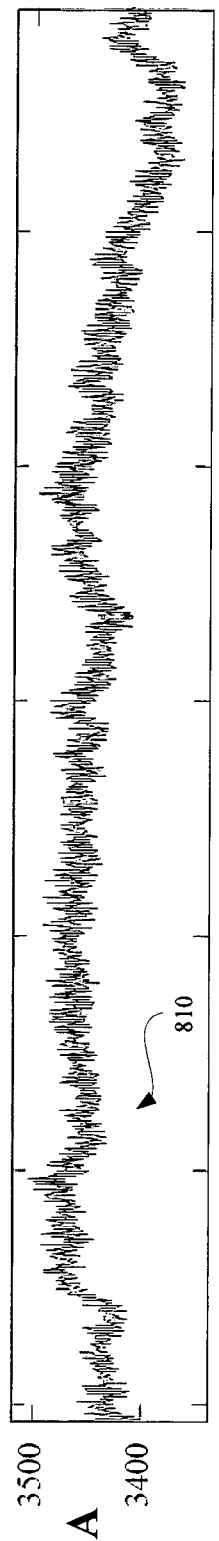
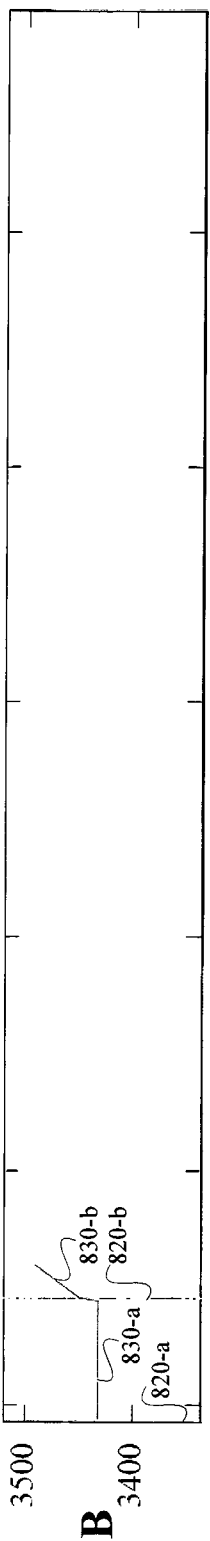
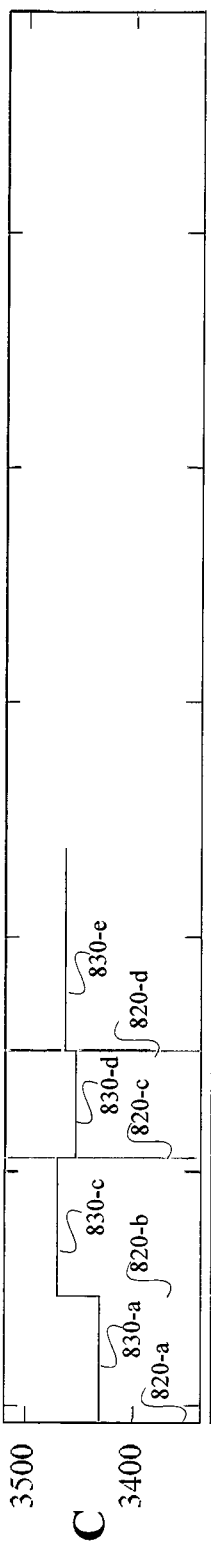
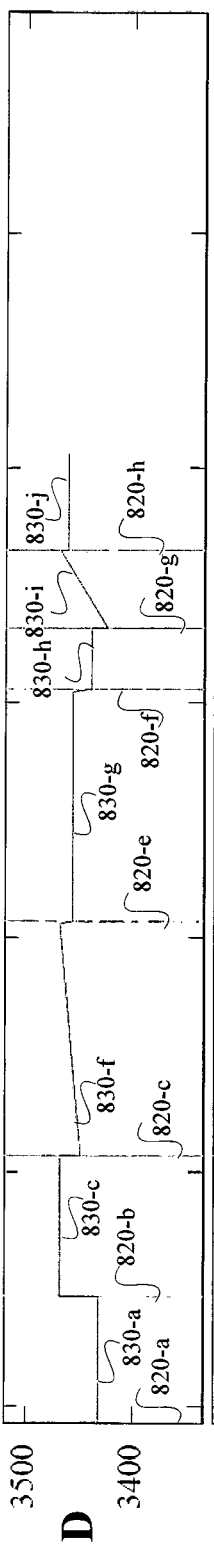
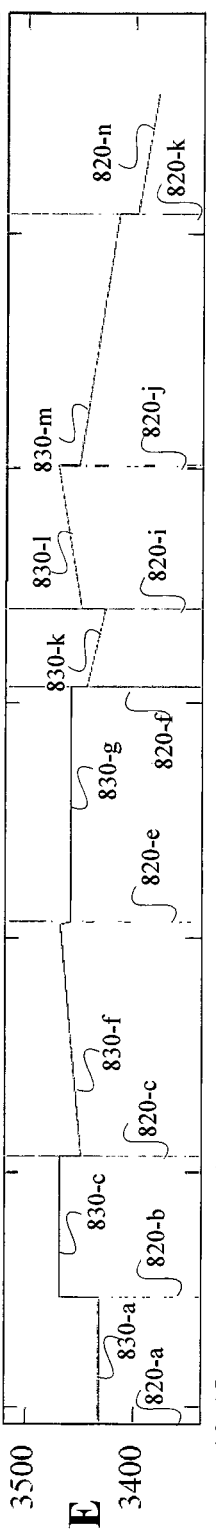
FIG. 8A
FIG. 8B
FIG. 8C
FIG. 8D
FIG. 8E

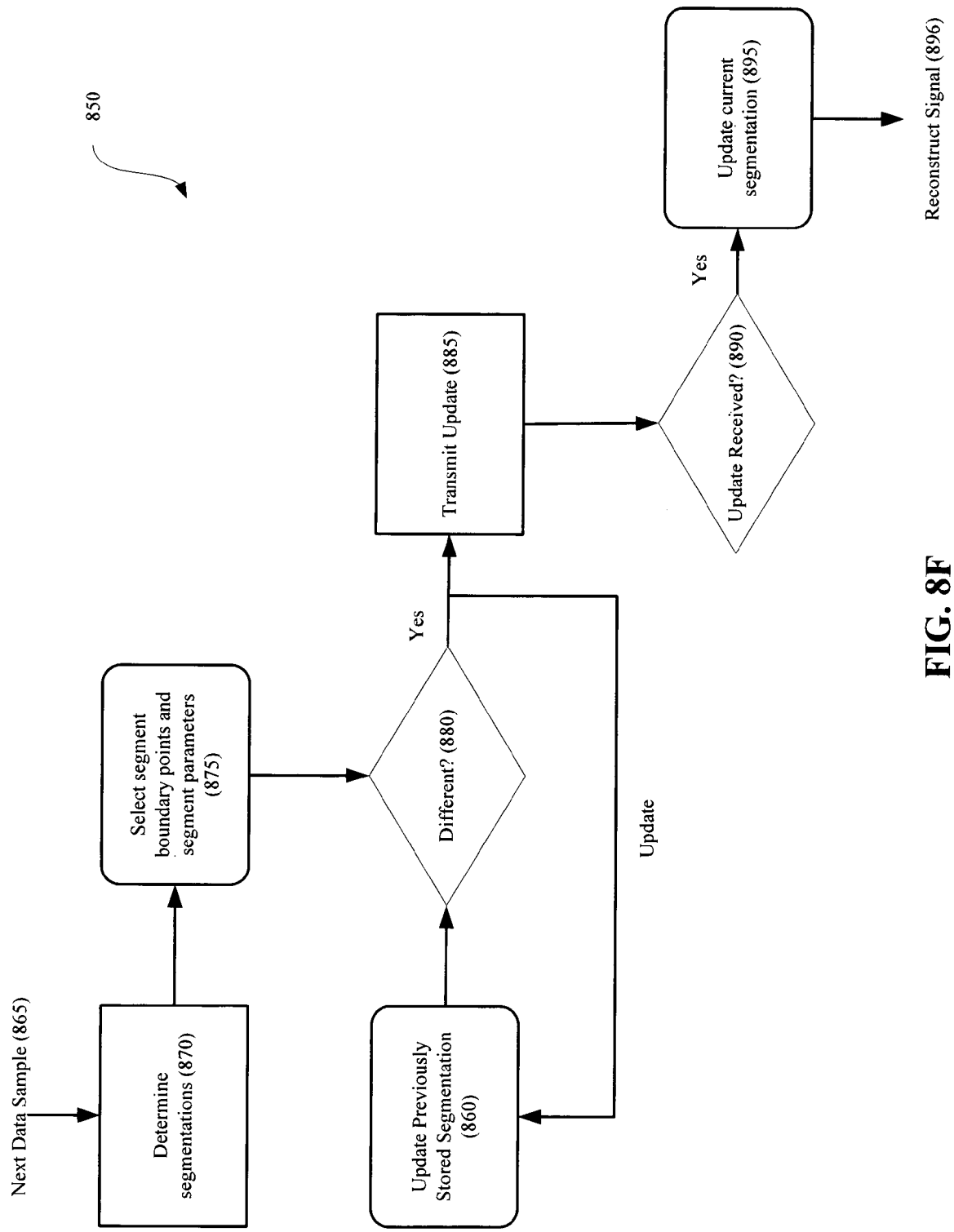

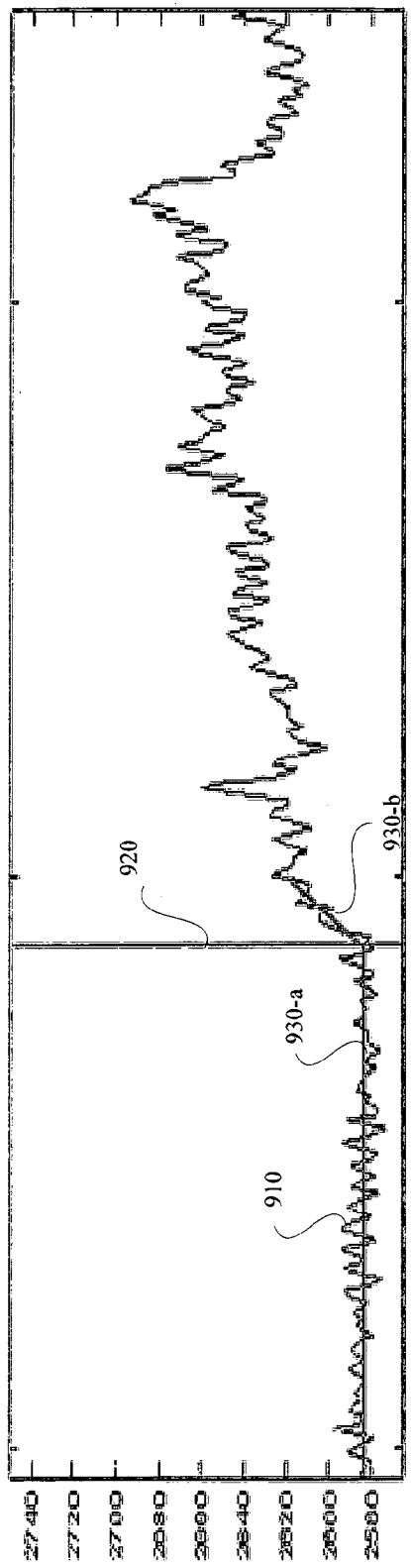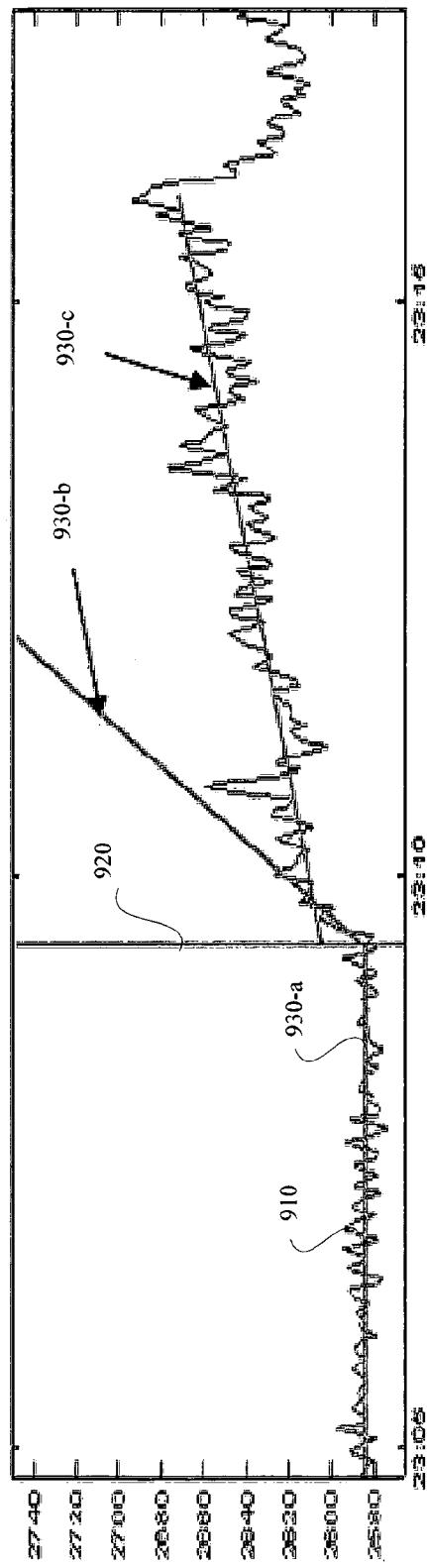

REAL TIME DATA COMPRESSION AND TRANSMISSION

CROSS-REFERENCE TO RELATED APPLICATIONS

This application claims priority as a 35 U.S.C. §371 application to PCT Application Number PCT/IB2011/000762 filed Apr. 8, 2011, which claims priority to British Patent Application Serial Number GB1005913.7 filed Apr. 9, 2010. Both of these applications are incorporated by reference herein in their entireties.

BACKGROUND

Many industries, such as the hydrocarbon industry, gather and utilize a wide variety of data collected from different signals from different sensors. The data often needs to be stored and/or transmitted efficiently. Breaking data into smaller, homogeneous segments has been used extensively to compress a variety of data. These techniques, however, generally compress the entire dataset as a block. Those that claim to be real-time generally work by buffering a large amount of data. This data is then compressed as a block, before it is transmitted or stored.

In many industries, there are more and better sensors providing more detailed information that must be transmitted, processed, acted upon and/or the like. In information technology, cloud computing, satellite transmissions and/or the like, it is often bandwidth that is the limiting factor on data transmission and/or processing. Merely by way of example, in the hydrocarbon industry, there are ever more and better sensors for sensing data related to the exploration, extraction, production and/or transportation of the hydrocarbons. To better handle the storage and transmission of data gathered from sensors—such as in the hydrocarbon industry the sensors related to the exploration, extraction, production and/or transportation of the hydrocarbons—the sensed data associated with the processes needs to be effectively and efficiently handled.

BRIEF SUMMARY

Embodiments of the present invention provide systems, methods, and/or devices for compressing data received from sensors and/or data to be transmitted through a communication channel. In aspects of the present invention, the sensors may comprise sensors utilized in a hydrocarbon operation. Embodiments may utilize different segmentation tools and techniques for modeling the sensor data. The compressed data may be transmitted and/or stored in some cases.

In some embodiments, with each new data sample passed to the system, the most likely segmentation (up to the current time) may be efficiently computed and changes are transmitted and/or stored. These changes can include real-time data and/or historical data. The mostly likely reconstruction (back to some point in history) can change with the knowledge of new data. A consequence of this updating of segmentation is that the receiver or storage device, may modify data that it already has stored or displayed. This updating process can differentiate these segmentations technique from existing techniques.

Methods and systems are provided for compressing and transmitting field data from a downhole sensor of a hydrocarbon operation in accordance with various embodiments. Multiple data samples from the downhole sensor are identified. Multiple segmentations of the multiple data samples from the downhole sensor are determined. Each segmentation may include one or more segments. Each segment may include a segment boundary point that may reflect a point in the data samples where a threshold has been exceeded with respect to the data samples of a previous segment or a point where the data samples begin. Each segment may also include one or more segment parameters that provide a linear representation of the data samples for the respective segment. One of the determined segmentations is selected to represent the multiple data samples based on a maximum a posteriori analysis of the determined plurality of segmentations. The segment boundary point and one or more segment parameters for each of the one or more segments of the selected segmentation are stored. A subset of the multiple data samples from the downhole sensor may be buffered. The segment boundary point and one or more segment parameters for each of the one or more segments of the selected segmentation are transmitted to a surface device of the hydrocarbon operation.

In some embodiments, methods and/or systems may further include identifying additional data samples from the downhole sensor. Multiple updated segmentations of the multiple data samples and the additional data samples into one or more segments may be determined. One of the determined updated segmentations may be selected to represent the multiple data samples and additional data samples based on a maximum a posteriori analysis of the determined updated plurality of segmentations. Difference information between the determined segmentation of the multiple data samples and the updated segmentation of the multiple data samples and the additional data samples may be determined. The difference information may include information such as adding a new segment boundary point, deleting a stored segment boundary point, and/or revising one or more stored segment parameters of one or more segment. The stored segment boundary point and one or more segment parameters for each of the one or more segments of the determined segmentation based on the determined difference information may be updated.

Methods and systems are provided for compressing sensor data in accordance with various embodiments. Methods and systems may include identifying multiple data samples from a first sensor. A segmentation of the multiple data samples from the first sensor are determined. The determined segmentation may includes multiple segments of varying sizes. Each segment of the determined segmentation may include one or more segment parameters that provide a representation of the data samples for the respective segment. Each segment may also include a segment boundary point that indicates a point in the data samples where a threshold has been exceeded for the data samples with respect to the one or more segment parameters of a previous segment. The segment boundary point and one or more segment parameters for each of the one or more segments of the determined segmentation are stored.

In some embodiments, the methods and systems may also include determining multiple segmentations of the data samples from the first sensor. One of the segmentations may be selected based on a most probable segmentation analysis of multiple segmentations. The selected segmentation may be utilized as the determined segmentation.

The threshold may depend upon at least a transmission bandwidth constraint or a storage constraint. The one or more segment parameters of a respective segment may provide a linear model of the respective segment in some cases. The linear model of a respective segment may include a gradient and/or an axis intercept. The linear model of a respective segment may include a step function and/or a ramp function.

The or more segment parameters of a respective segment may provide a non-linear model of the respective segment in some cases.

Some embodiments may further include transmitting the segment boundary point and one or more segment parameters for each of the one or more segments of the determined segmentation. Transmitting the segment boundary point and one or more segment parameters for each of the one or more segments of the determined segmentation may occur at a rate less than 3 kilobits per second, at a rate less than 1 kilobits per second, and/or at a rate less than 100 bits per second in some cases. Transmitting the segment boundary point and one or more segment parameters for each of the one or more segments of the determined segmentation may occur dynamically based on a bandwidth constraint. In some cases, transmitting the segment boundary point and one or more segment parameters for each of the one or more segments of the determined segmentation may include delaying the transmission based on bandwidth considerations.

In some embodiments, a noise variance for each segment of the determined segmentation may be determined. The noise variance for each segment of the determined segmentation may be stored and transmitted.

Some embodiments may further include identifying additional data samples from the first sensor. An updated segmentation of the multiple data samples and the additional data samples may be determined. Difference information between the determined segmentation of the data samples and the updated segmentation of the data samples and the additional data samples may be determined. The difference information between the determined segmentation of the data samples and the updated segmentation of the data samples and the additional data sample may be stored. In some cases, difference information may be transmitted. For example, the difference information may be transmitted from a downhole device and/or system to a surface device and/or system. The difference information may include adding one or more new segment boundary points, adding one or more new segment parameters, deleting one or more stored segment boundary point, and/or revising one or more stored segment parameters of one or more segments.

Some embodiments may also include identifying data samples from a second sensor. A segmentation of the data samples of the second sensor into one or more segments may be determined. Each segment of the segmentation may includes the segment boundary point from the determined segmentation of the data samples of the first sensor. Each segment may also include one or more segment parameters that provide a representation of the data samples of the second sensor for the respective segment. The one or more segment parameters for each of the one or more segments of the determined segmentation of the data samples of the second sensor may be stored, and in some cases the segment boundary point and one or more segment parameters for each of the one or more segments of the determined segmentation of the data samples of the first sensor and the second sensor may be transmitted.

Methods and systems are provided for receiving compressed sensor data representing data from a sensor in accordance with various embodiments. The methods and systems may include receiving multiple segment boundary points. Each segment boundary point may indicate a point in the data where a threshold has been exceeded for the data. Multiple segment parameters may be received. Each of the respective segment parameters may be linked with a respective segment boundary point. Each of the one or more segment parameters may provide information regarding a representation of the data samples for the respective segment. The segment boundary points and the segment parameters are stored. The segment boundary points and the segment parameters are utilized to represent a plurality of data samples as multiple segments.

Embodiments may also include receiving one or more additional segment boundary points and/or one or more additional segment parameters. The segments may be updated utilizing the one or more additional segment boundary point and/or one or more additional segment parameters. In some cases, one or more segment updating instructions may be received. The segment updating instructions may include instructions to delete at least one of the segment boundary points or one of the segment parameters. The segment updating instructions may include instructions to change at least one of the segment boundary points or one of the segment parameters.

In some cases, the segments may be presented in an electronic display. The one or more segment parameters of a respective segment may provide a linear model of the respective segment. The linear model of respective segment may include at least a gradient or an axis intercept. The linear model of a respective segment may include at least a step function or a ramp function. In some cases, segment parameters of a respective segment may provide a non-linear model of the respective segment.

In some cases, the segment boundary points and the segment parameters may be received at different rates, such as at a rate less than 3 kilobits per second, at a rate less than 1 kilobits per second, or at a rate less than 100 bits per second, for example. The rate may be determined dynamically based on a bandwidth constraint. Some embodiments may also include receiving noise variances. Each respective noise variance may be associated with a respective segment.

BRIEF DESCRIPTION OF THE DRAWINGS

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

FIGS. 6A, 6B, 6C, and 6D provide graphs illustrating a segmentation technique utilizing batch or historical data in accordance with various embodiments.

FIGS. 7A, 7B, and 7C provide three examples of segmentations in accordance with various embodiments.

FIGS. 8A, 8B, 8C, 8D, and 8E provide graphs illustrating a segmentation technique utilizing real-time data in accordance with various embodiments.

FIG. 8F provides a framework for utilizing a segmentation technique to compress, transmit, and reconstruction a signal in accordance with various embodiments.

FIGS. 9A and 9B provide graphs illustrating a segmentation technique for updating segment parameters in accordance with various embodiments.

DETAILED DESCRIPTION

Figure 1:
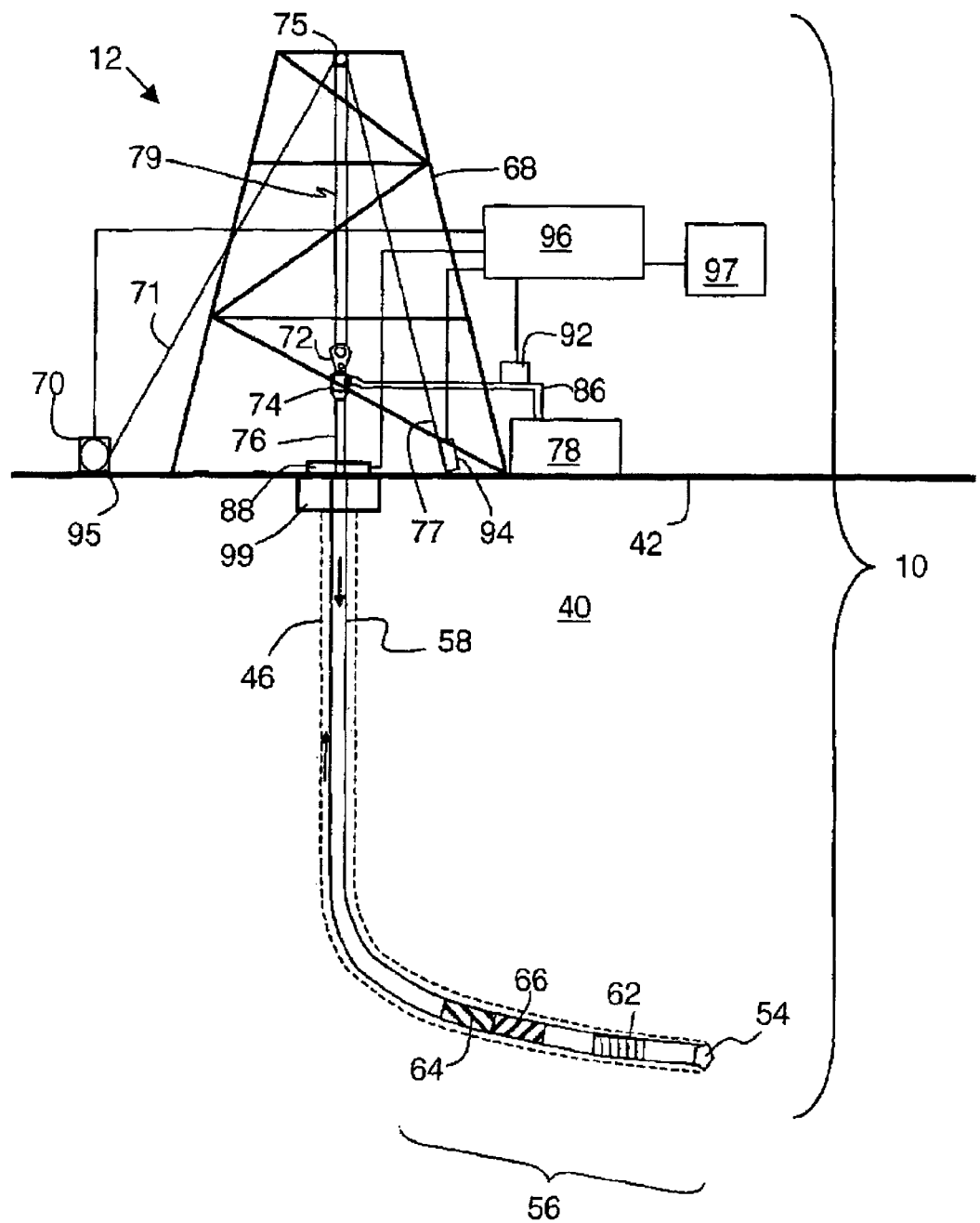
FIG. 1 provides a schematic diagram illustrating a drilling system in accordance with various embodiments.

Tools and techniques are provided for compressing one or more channels of data and reconstructing a representation of the data locally and/or at a different location in real-time. The techniques may use segmentation techniques that break a signal into a sequence of segments that may best model the original data sequence. Each segment may be described by a set of parameters, which may be a minimal set of parameters in some cases. As each new data sample is passed to the system, the best segmentation (back to some point in history) may efficiently be recomputed and changes to the segmentation may be transmitted and/or stored. A receiver may then be able to reconstruct a close approximation of the original signal with minimal data transmitted. These techniques may be applicable to the transmission and storage of a wide variety of signals, including real-time measurements made in the oilfield. The tools and techniques provided may also have application in speech and audio signals, biomedical signals, and/or financial time-series, for example.

In the following detailed description, reference is made to the accompanying drawings that show, by way of illustration, specific embodiments may be provided. These embodiments are described in sufficient detail to enable those skilled in the art to practice the invention. It is to be understood that the various embodiments, although different, are not necessarily mutually exclusive. For example, a particular feature, structure, or characteristic described herein in connection with one embodiment may be implemented within other embodiments without departing from the spirit and scope of the embodiments. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

It should also be noted that in the development of any such actual embodiment, numerous decisions specific to circumstance must be made to achieve the developer's specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

FIG. 1 shows a drilling system 10 that may utilize segmentation techniques in accordance with various embodiments. As depicted, a drill string 58 is shown within a borehole 46. The borehole 46 is located in the earth 40 having a surface 42. The borehole 46 is being cut by the action of a drill bit 54. The drill bit 54 is disposed at the far end of the bottomhole assembly 56 that is itself attached to and forms the lower portion of the drill string 58.

The bottomhole assembly 56 contains a number of devices including various subassemblies. According to various embodiments, measurement-while-drilling (MWD) subassemblies may be included in subassemblies 62. Examples of typical MWD measurements include direction, inclination, survey data, downhole pressure (inside the drill pipe, and outside or annular pressure), resistivity, density, and porosity. The subassemblies 62 may also include is a subassembly for measuring torque and weight on bit.

The subassemblies 62 may generate signals related to the measurements made by the subassemblies 62. The signals from the subassemblies 62 may be processed in processor 66. After processing, the information from processor 66 may be communicated to communication assembly 64. The communication assembly 64 may comprise a pulser, a signal processor, an acoustic processor and/or the like. The communication assembly 64 converts the information from processor 66 into signals that may be communicated as pressure pulses in the drilling fluid, as signals for communication through an optic fibre, a wire and/or the like, or signals for wireless or acoustic communication and/or the like. Embodiments may be used with any type of sensor associated with the hydrocarbon industry and with any type of telemetry system used with the sensor for communicating data from the sensor to the processor 66.

The subassemblies in the bottomhole assembly 56 can also include a turbine or motor for providing power for rotating and steering drill bit 54. In different embodiments, other telemetry systems, such as wired pipe, fiber optic systems, acoustic systems, wireless communication systems and/or the like may be used to transmit data to the surface system.

The drilling rig 12 includes a derrick 68 and hoisting system, a rotating system, and a mud circulation system. The hoisting system which suspends the drill string 58, includes draw works 70, fast line 71, crown block 75, drilling line 79, traveling block and hook 72, swivel 74, and deadline 77. The rotating system includes kelly 76, rotary table 88, and engines (not shown). The rotating system imparts a rotational force on the drill string 58 as is well known in the art. Although a system with a kelly and rotary table is shown in FIG. 1, those of skill in the art will recognize that embodiments may also be applicable to top drive drilling arrangements. Although the drilling system is shown in FIG. 1 as being on land, those of skill in the art will recognize that the present invention is equally applicable to marine environments.

The mud circulation system pumps drilling fluid down the central opening in the drill string. The drilling fluid is often called mud, and it is typically a mixture of water or diesel fuel, special clays, and other chemicals. The drilling mud is stored in mud pit 78. The drilling mud is drawn in to mud pumps (not shown), which pump the mud through stand pipe 86 and into the kelly 76 through swivel 74 which contains a rotating seal.

The mud passes through drill string 58 and through drill bit 54. As the teeth of the drill bit grind and gouges the earth formation into cuttings the mud is ejected out of openings or nozzles in the bit with great speed and pressure. These jets of mud lift the cuttings off the bottom of the hole and away from the bit 54, and up towards the surface in the annular space between drill string 58 and the wall of borehole 46.

At the surface the mud and cuttings leave the well through a side outlet in blowout preventer 99 and through mud return line (not shown). Blowout preventer 99 comprises a pressure control device and a rotary seal. The mud return line feeds the mud into separator (not shown) which separates the mud from the cuttings. From the separator, the mud is returned to mud pit 78 for storage and re-use.

Various sensors are placed on the drilling rig 10 to take measurement of the drilling equipment. In particular hookload is measured by hookload sensor 94 mounted on deadline 77, block position and the related block velocity are measured by block sensor 95 which is part of the draw works 70. Surface torque is measured by a sensor on the rotary table 88. Standpipe pressure is measured by pressure sensor 92, located on standpipe 86. Additional sensors may be used to detect whether the drill bit 54 is on bottom. Signals from these measurements may communicate with a processor located downhole, such as processor 66 and/or communicated to a central surface processor 96. In addition, mud pulses traveling up the drillstring may be detected by pressure sensor 92.

Pressure sensor 92 comprises a transducer that converts the mud pressure into electronic signals. The pressure sensor 92 may be connected to a downhole processor 66 and/or surface processor 96 that converts the signal from the pressure signal into digital form, stores and demodulates the digital signal into useable MWD data. According to various embodiments, surface processors 96 and/or subsurface processor 66 may be programmed to automatically carry out the segmentation processes as described herein Processors 66 and/or 96 may transmit the segmentation information to user interface system 97 or other receiver devices.

In the process of drilling a borehole, multiple sensors may be used to monitor the drilling process—including, but not limited to, the functioning of the drilling components, the state of drilling fluids or the like in the borehole, the drilling trajectory and/or the like—characterize the earth formation around or in front of the location being drilled, monitor properties of a hydrocarbon reservoir or water reservoir proximal to the borehole or drilling location and/or the like.

Figure 2:
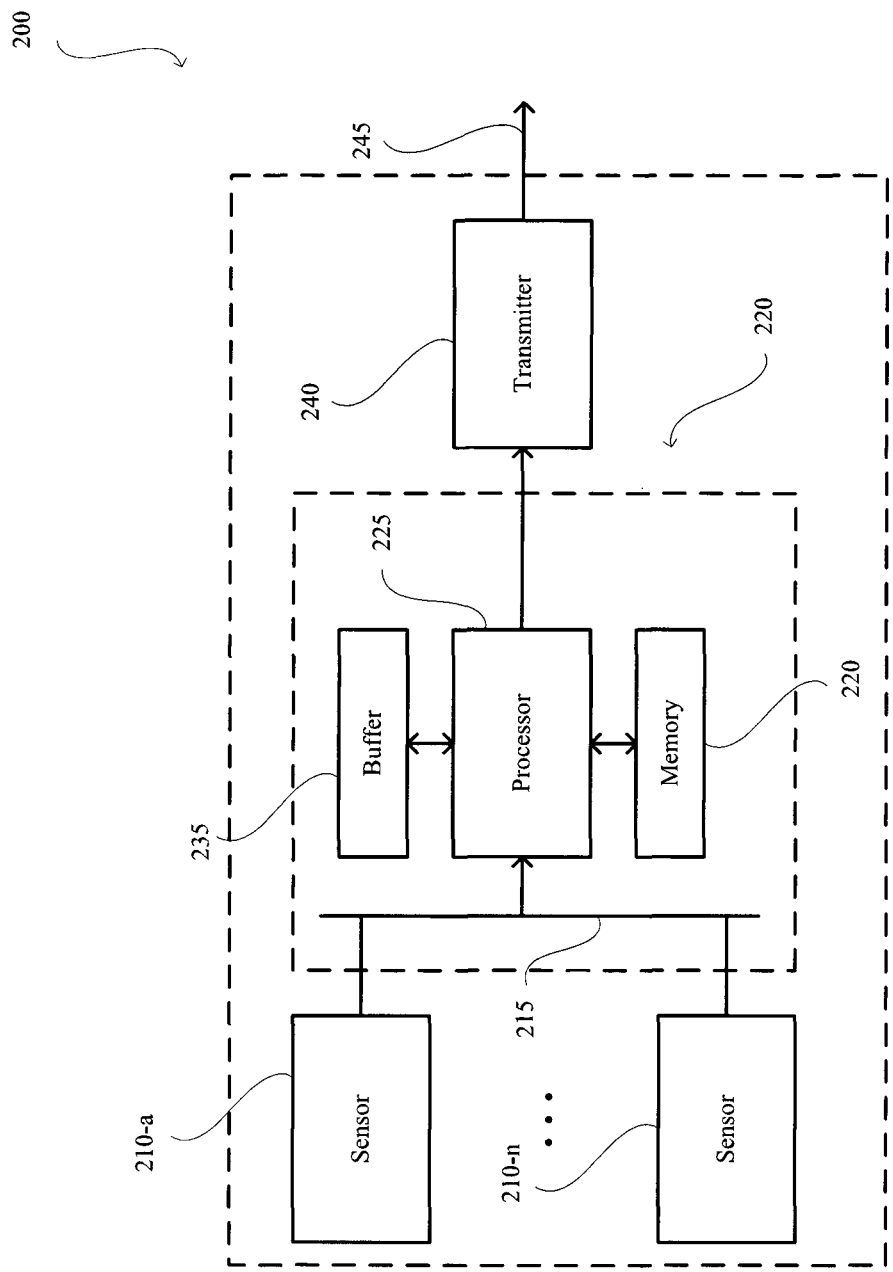
FIG. 2 provides a schematic diagram of a transmitting system in accordance with various embodiments.

FIG. 2 provides an example of a system 200 for segmenting data from one or more sensors 210-*a*, . . . , 210-*n* according to various embodiments. Sensors 210 may include sensors such as subassembly 62, pressure sensor 92, block sensor 95, hookload sensor 94, or sensors connected with drill bill 54, merely by way of example. Information from sensors 210 may be transmitted to processor 225 via a bus 215. Processor 225 may include processors such as processors 66 and/or 96 of FIG. 1, for example. Processor 225 may segment data from sensors 210 according to various embodiments as discussed above and below in more detail. In some embodiments, system 200 may include one or more buffers 235 for temporary storing data samples. In addition, system 200 may include one or more memories 220 for storing data in general. In some cases, processor 225, memory 220, and/or buffer 235 may be collectively referred to as a data analyzer 220. System 200 may also include a transmitter 240 that may be utilized to transmit segmentation information determined by processor 225. For example, system 200 may be located downhole, as seen in FIG. 1, as part of bottomhole assembly 56. In other cases, system 200 may be part of the surface components associated with drill rig 12.

Figure 3:
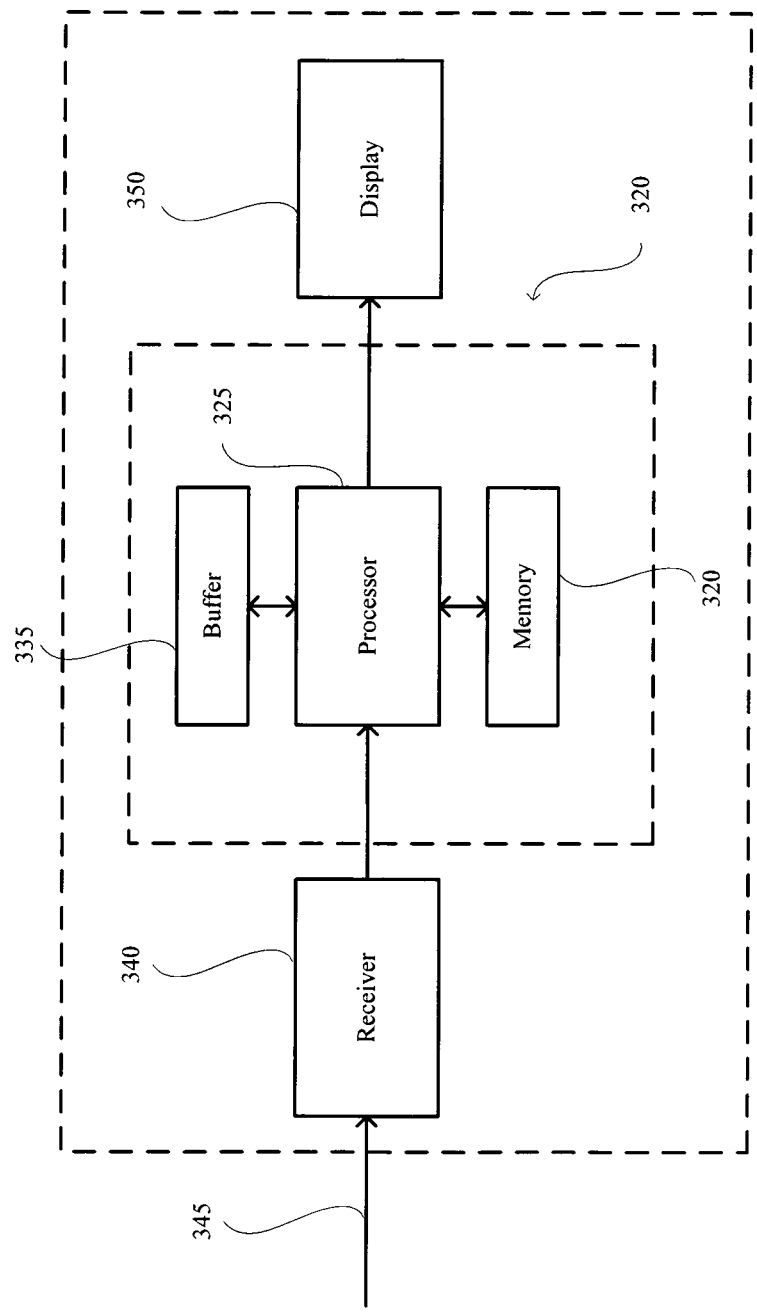
FIG. 3 provides a schematic diagram of a receiving system in accordance with various embodiments.

FIG. 3 provides an example of a system for receiving data segmentation information in accordance with various embodiments. System 300 may include a receiver 340 for receiving segmentation information. In some cases, receiver 340 may receive segmentation information from a transmitter such as transmitter 240 of system 200 of FIG. 2. Receiver 340 may be configured to receiver data segmentation information via wired and/or wireless technologies. System 300 also includes a processor 325. In some cases, processor 325 may include processor 96 of FIG. 1. Processor 325 may process received data segmentation information and store it in a memory 320 and/or temporary store it in a buffer 335. In some cases, processor 325 may prepare the data segmentation information for presentation on a display 350. In some cases, processor 325, memory 320, and/or buffer 335 may be collected referred to as a data analyzer 320. System 300 may be located in some cases as part of surface components associated with drill rig 12. In some cases, system 300 may be located in other locations remote from drill rig 12.

Embodiments provide tools and techniques for compressing data using a variety of segmentations tools and techniques to handle a variety of situations. In some cases, embodiments may work in real-time data, while others handle batch data. Methods, systems, and devices are provided to break a signal or sequence of data samples into one or more segments in accordance with various embodiments. Each segment can be described by model, which may be a linear model. The resulting sequence of models and their associated parameters can provides a higher-level description of the signal or data that may use significantly less memory to store or bandwidth to transmit.

Embodiments may significantly aid the transmission over often congested channels, such as from downhole devices to surface devices or from remote field locations to a central office. Embodiments can also aid with the storage of data where memory is limited, such as in downhole devices. Compression is becoming increasingly important during oilfield operations, as more measurements are made, stored and transmitted, and as control and operations are increasingly being performed remotely.

Embodiments provide tools and techniques for compressing signals and/or data utilizing a sequence of models. The output sequence of models can efficiently describe the signal or data, while using significantly less memory to store or bandwidth to transmit. Signal compression is becoming increasingly important during oilfield operations, as more measurements are made, stored and transmitted, and as control and operations are increasingly being performed remotely. For example, applications for segmentation compression include maximizing bandwidth between downhole and surface, or between remote field locations and a central office, and storing recorded measurements in downhole tools where memory is limited.

In some embodiment, a sequence of segment boundary points and segment parameters are determined at some data sample, T, for a series of data samples determined from a signal from a sensor. The segment boundary points and segment parameters may be determined such that they may provide a best model for the signal being analyzed within each segment. For example, consider a case where there are K segments. The start of each segment being given by $s_k$, which may be referred to as a segment boundary point. The modeled signal during segment k be may be represented as:

$$y_t = f(t-s_k, \theta_k) \quad \text{Equation 1}$$

where $s_k <= t < s_{k+1}$ and $s_{k+1} = T$. f can provide the model and $\theta_k$ are the segment parameters of the model for the duration of segment k. Different models for each segment can be encoded in f and one of the segment parameters can be used to select which model to use during segment k for example. Segmentation techniques can provide K, $s_k$ and $\theta_k$ (for all k=1 . . . K) such that $y_t$ best matches the original signal, $Y_t$, under some criteria (for all t=1 . . . T).

Figure 4:
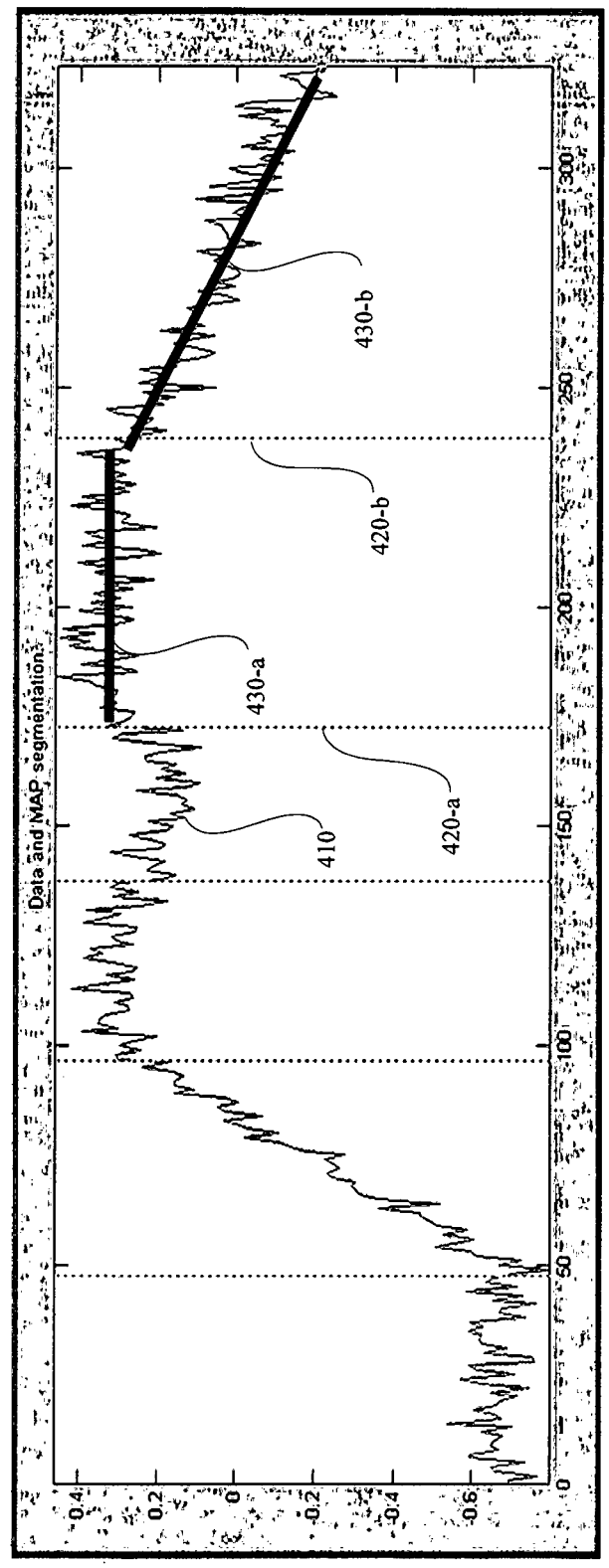
FIG. 4 provides a graph illustrating a segmentation technique in accordance with various embodiments.

An example of the output of a segmentation technique in accordance with various embodiments is shown in FIG. 4. In this case, the models used for each segment are linear models and the segment parameter set, $\theta_k$, include a gradient and/or a y-intercept for each segment. FIG. 4 shows a signal 410 that is being modeled using the segmentation technique. Segment boundary points are shown with vertical dashed lines that may reflect where the signal changes in some way. For example, the data sampled from the signal may exceed a certain threshold at a given segment boundary point. This change in the data may reflect the need for a new model, or new set of segment parameters, to be used to model the following data. FIG. 4 shows several specific segment boundary points 420-a and 420-b that may be represented by respective values $s_k$ in Equation 1. A first segment 430-a that starts at segment boundary point 420-a may be represented by a linear model such as y=k, where k is a constant that may be part of a segment parameter set $\theta_k$ for segment 430-a; in some embodiments, the model may also include a noise variance term.

At segment boundary point 420-b, the signal has changed enough that a new model may be utilized to model the signal. In this case, segment 430-b that starts at segment boundary point 420-b may be modeled by a linear model such as y=mx+c, where m reflects a gradient or slope of the segment 430-b and c reflects an intercept, such as a y-axis intercept; m and c may be part of a segment parameter set $\theta_k$ for segment 430-b. In some embodiments, segments 430-a and 430-b, along with their associated segment boundary points 420-a and 420-b along with segment parameters $\theta_k$, may be stored and/or transmitted.

In some embodiments, multiple segmentations of signal 410 may be determined. The segmentation that may be stored and/or transmitted may reflect a most probable segmentation; in some embodiments, the most probable segmentation may reflect a segmentation determined from a maximum a posteriori or other Bayesian analysis of the possible segmentations of the sampled data.

Some embodiments may utilize arbitrary linear models. FIG. 4 shows an example where the segment parameters may also be represented by steps and ramps, where segment 430-a represents a step and segment 430-b represents a ramp. In some cases, steps and ramps may effectively describe a wide variety of signals, particularly from the drilling process. Other models may be utilized, although these models may require additional encoding than the model being used with its linear parameters. These other models might have an advantage if different signals are best described by very different signals (for example, if one signal contains only steps while another only quadratics or cubics or other polynomials).

Segmentation techniques in accordance with various embodiments provide a number of likely signal segmentations. Some embodiments may utilize or provide the most probable segmentation. This segmentation may be a maximum a posteriori (MAP) segmentation for the purpose of compression.

Figure 5A:
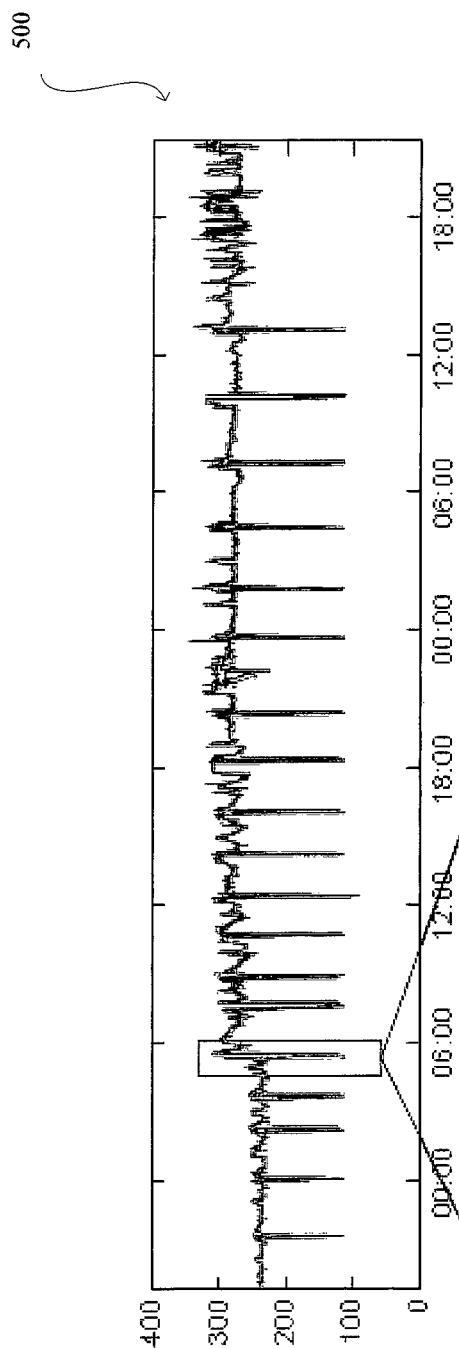
FIGS. 5A, 5B, and 5C provide graphs illustrating a segmentation technique in accordance with various embodiments.
Figure 5B:
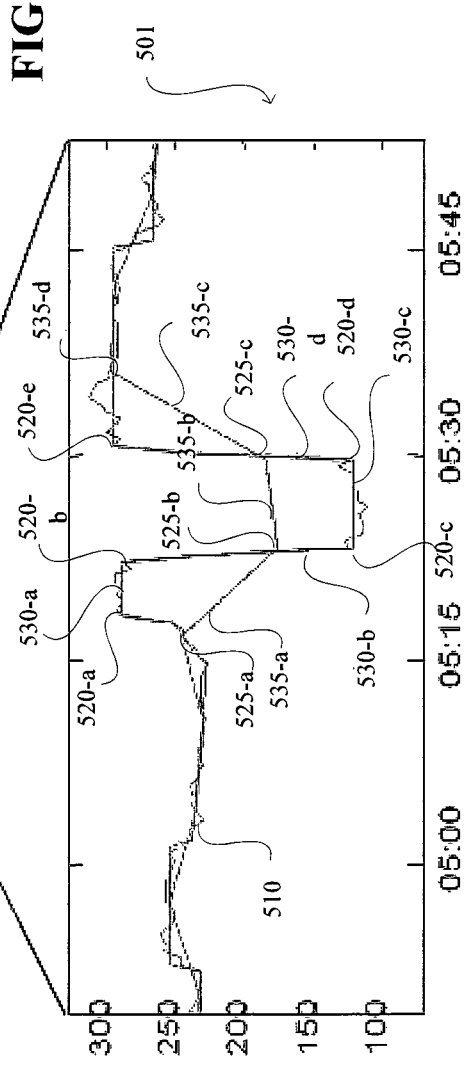
Figure 5C:
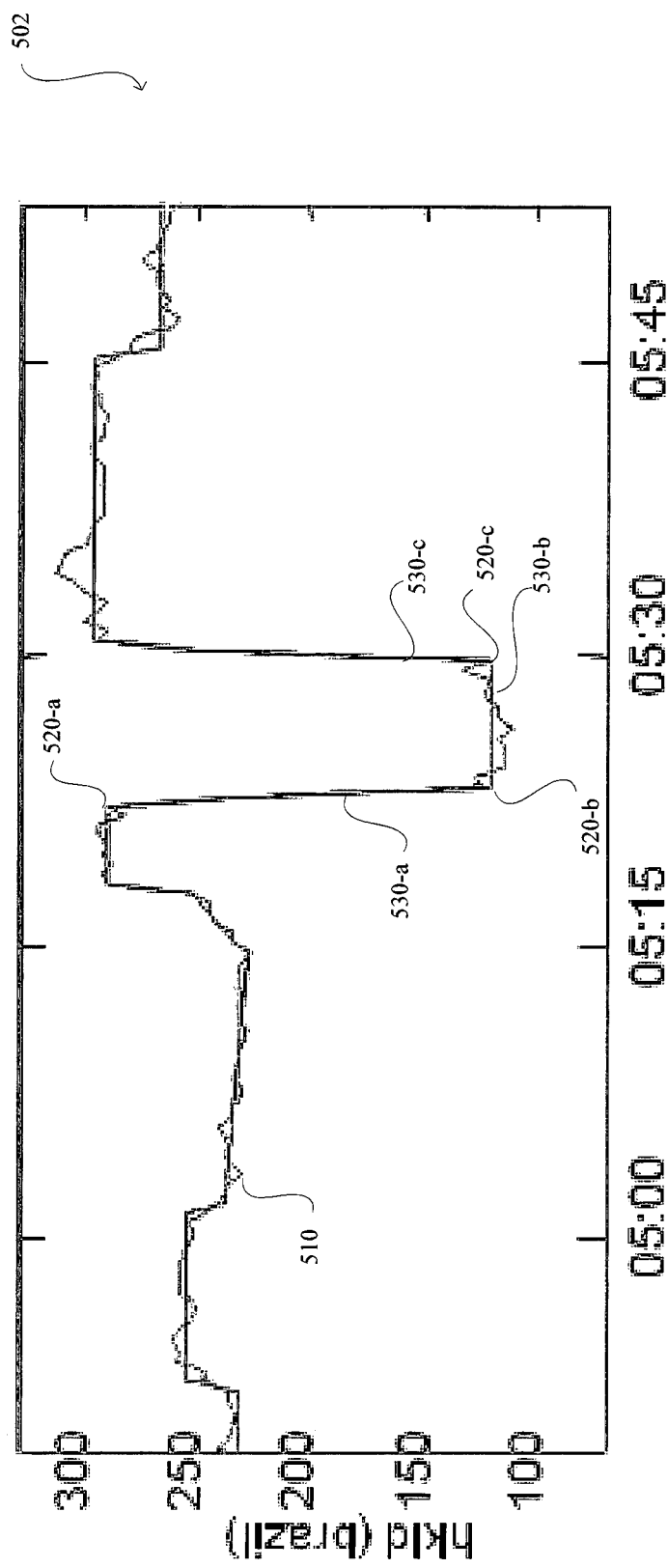

FIG. 5A, FIG. 5B, and FIG. 5C provide another example of a segmentation of a signal in accordance with various embodiments. FIG. 5A provides a graphical representation 500 of an original signal, a segmentation of the signal in accordance with various embodiments, and a decimation of the original signal. FIG. 5B provides a magnified section 501 from graph 500 to better illustrate the differences between the original signal, the segmentation of the signal, and the decimation of the signal. For example, magnified section 501 shows original signal 510.

In addition, section 501 show examples of the signal being decimated by an amount necessary to provide the same compression rate as that given by the segmentation techniques. The decimation of the signal is represented in part by points 525-a, 525-b, 525-c, and 535-d that are equally spaced along the time axis. A portion of original signal 510 is then modeled by segments 535-a, 535-b, and 535-c that are bounded by points 525-a, 525-b, 525-c. This decimated representation of signal 510 defines the signal at fixed time intervals. In contrast, the segmentation example shown in these figures uses the times when the signal changes. Portions of this segmentation example include segment boundary points 520-a, 520-b, 520-c, and 520-d, with segments defined by 530-a, 530-b, and 530-c. Segment boundary points 520-a, 520-b, 520-c, and 520-d can reflect points where signal 510 changes; for example, these points may reflect where signal 510 changes more than some given threshold. Segments 530-a, 530-b, and 530-c may then be represented by segment parameters. In aspects of the present invention, the threshold may be set based upon knowledge, which may be statistical knowledge, modeling knowledge, probabilistic knowledge, experimental knowledge, prior data handling knowledge and/or the like; for example knowledge of variances in sensor outputs etc.

As is apparent from section 501, the segment boundary points and segments provide a better representation of original signal 501 then does the decimation points and segments. Embodiments utilizing such segmentation techniques as shown in section 501 may provide efficient coding strategies. FIG. 5C provides a different perspective on the content of FIG. 5B, showing the original signal and the segmentation of the signal in accordance with various embodiments, but does not show the decimated version of the signal.

Some embodiments can be used as a batch process to compress a sequence of data, for example, the log data from a tool's memory dump, or a block of missing data to be transmitted after a communications link has been down for a period of time. For example, FIG. 4 and FIG. 5 may reflect that data has been collected and then the data is processed as a batch to produce the compressed data using a segmentation technique in accordance with various embodiments. These figures may also reflect real-time data that may be analyzed in real-time in accordance with various embodiments. Merely by way of example, in some aspects of the present invention, when data being received falls into, is within the threshold, of the model being applied to the data, no transmission of this fact may be required.

Some embodiments may use prior probability distributions of the unknown parameters to determine how many segment boundary points to use for a given segmentation technique. These approaches may be applicable to both real-time and batch processing of signals. By adjusting these prior probability distributions, it may possible to adjust the resolution at which different embodiments tracks the detail of the signal. In some cases, prior probability distributions on the noise variance and/or the expected probability of a segment boundary point may be particularly useful, though other prior probability distributions may be utilized.

An example of the effect of different prior probability distributions is shown in FIGS. 6A-6D. FIG. 6A shows a graph of a signal, which may be stored samples in some cases, that may be modeled utilizing a segmentation technique in accordance with various embodiments. In FIGS. 6B-6D, three different examples with different prior probability distributions are utilized, resulting in different numbers of segment boundary points. The segment boundary points are represented by the vertical lines distributed horizontally along each graph. Between segment boundary points are segments that may be represented by segment parameters. In these figures, the prior probability distributions generated 22 segment boundary points (FIG. 6B), 15 segment boundary points (FIG. 6C) and 7 segment boundary points (FIG. 6D). The resulting three examples provide compression of the signal that are 2.5%, 1.7% and 0.8% respectively of the original signal of FIG. 6A. As can be seen, the prior probability distributions can be used to trade off between how much signal detail may be retained and how compressed the signal becomes.

Some embodiments can be used to compress a real-time data stream directly to memory. For example, when a downhole tool has limited memory and needs to take measurements over a long period may store the compressed data in a local memory. In this case, the downhole tool may have no problem to change past data written to its memory and the resulting compressed signal can be identical to a batch compression scenarios.

Some embodiments may also be used in an environment where memory is limited. In these cases, the amount of memory required just to implement an embodiment (as opposed to memory needed to store the resulting compressed signal) may need to be considered. In some embodiments, segmentation techniques may consider a number (for example, 50 or 100) of possible segmentations, and the compressed stream for each of these (for some fixed length of history) is kept in memory.

In some embodiments, a signal may be segmented into the most probable, or maximum a posteriori, sequence of segments. This process may generates N segments, each including of a starting index, or segment boundary point, and two linear parameters (a gradient and y-intercept for example). For example, FIG. 7A shows one such segmentation, where the $x_1 \, x_2 \, x_3 \, x_4 \, x_5 \ldots$ represent the raw data and $s_1 \, m_1 \, c_1 \, s_2 \, m_2 \, c_2 \ldots$ represent the compressed signal. In this example, $s_n$ represents the segment boundary point, which may be referred to as a start index in some cases, of segment n and $(m_n, c_n)$ are the linear parameters that describe the data in segment n. If the average segment length reported by the algorithm is L samples, then the size of the compressed signal may be represented as 3/L×the size of the original raw signal (where three numbers may be used to represent L, on average).

Some embodiments can also process multiple channels of data simultaneously. In some cases, each channel of data is broken into the same segmentation, but each are described by different parameters, such as segment parameters like a gradient and an axis intercept. This can save coding the segment boundary point for all but the first of the channels. FIG. 7B shows one such example for encoding multiple channels simultaneously. FIG. 7B shows raw data from a first channel $x_1 \, x_2 \, x_3 \, x_4 \, x_5 \ldots$ and a second channel $y_1 \, y_2 \, y_3 \, y_4 \, y_5 \ldots$ The compressed signal is then represented as $s_1 \, m_{1,1} \, c_{1,1} \, m_{1,2} \, c_{1,2} \, s_2 \, m_{2,1} \, c_{2,1} \, m_{2,2} \, c_{2,2} \ldots$ using segment boundary points $s_n$ along with parameters $m_{n,k}$ and $c_{n,k}$, which may be linear parameters in some cases, for segment n of channel k. If this technique is used to code K channels, the compressed signal may be represented as (2K+1)/L, the size of the original raw signal L.

In some embodiments, data samples from one sensor or channel may be correlated with data samples from a one or more other sensors or channels. For example, bit torque data may should be strongly correlated to the weight-on-bit (WOB) data within a given rock formation. The torque and WOB data from downhole measurements could therefore be compressed by a segmentation of WOB data samples with steps and ramps, or other linear parameters, with respect to time and a segmentation of the torque data that depends upon the segmentation of the WOB segmentation, such as utilizing ramps, or another linear parameter, with respect to WOB to model the torque data.

More generally, segmentations in accordance with various embodiments from two or more sensors may be correlated with each other or made dependent upon each other in some way. One example of such correlation or dependency may be to utilize the same segmentation boundary points for the segmentations with respect to the two or more channels or sensor data. In one particular case, segmenting the torque and WOB relationship may involve utilizing the segmentation boundary points for both the torque and WOB segmentations, along with determining changes in the segment parameters based on a relationship between the torque and WOB data. Transmitting changes in the slope and offsets for a torque/WOB relationship, for example, may be less likely to lose information about the formation than independently modelling WOB and torque with steps and ramps with respect to time. Embodiments that utilize relationships between two or more sensors or channels may be utilized in general.

Some embodiments may include information related to the noise of each signal. Some embodiments can, for example, provide as output the noise variance, $v_k$, for the residuals of each segment. This could also be encoded with the other segmentation parameters to provide more information at the receiver or storage device about the original signal. For example, some embodiments may determine the mean of the noise variance of the signal during each segment. This noise variance information may be stored and/or transmitted. Noise variance values could be encoded with the parameters representing a given segment, increasing the number of data points used to four per segment. For example, FIG. 7C shows one such example with raw data $x_1 \, x_2 \, x_3 \, x_4 \, x_5 \ldots$ and compressed signal $s_1 \, m_1 \, c_1 \, v_1 \, s_2 \, m_2 \, c_2 \, v_2 \ldots$, where $s_n$ represents the segment boundary point, which may be referred to as a start index in some cases, of segment n, $(m_n, c_n)$ are the linear parameters that describe the data in segment n, and $v_n$ is the estimate of noise variance for segment n.

Noise variance information can describe how much the signal is varying, which can provide valuable information not captured by the parameters representing a segment alone. For example, if a signal suddenly becomes noisier while its mean level remains constant, some embodiments may generate a segment boundary point. However, without knowledge of the noise variance, the significance of this segment boundary point may be lost.

Embodiments may provide signal compression that can match the original signal significantly better than other techniques. The benefit of the segmentation techniques may be particularly evident in those signals that change abruptly. For example, when flow is steady for long periods of time (while the pumps are on), then suddenly drops and rises (during a connection). In this case, some embodiments can efficiently allocate segment boundary points during the times when the pumps are shut down and restarted, while a decimated signal, for example, may undersample during these times and oversample while the flow is constant.

Some embodiments may be designed to work in real time. As each new data point is measured, the segmentation techniques can provide a new sequence of, likely segmentations with sets of segment boundary points and segment parameters. These outputs can be compared to those generated by the previous data points to determine whether the latest data provides any significant new information.

Segmentation technique in accordance with various embodiments may be utilized to compress and transmit a signal. In some cases, both a transmitting system, such as system 200 of FIG. 2, and a receiving system, such as system 300 of FIG. 3, may maintain a copy of the most recent segmentation of the data, which may be represented as data $s_k$, and $\theta_k$ for each segment K. In some cases, only changes to this segmentation are transmitted as new data samples are determined. When no data is being transmitted, a receiving system may be able to generate the model $y_t$ of a signal using the most recent segmentation and Equation (1).

This ability to use new data to update segment boundary points and/or segment parameters of the past is illustrated in FIGS. 8A, 8B, 8C, 8D, and 8E. Updated segmentation information may be determined at one location, such as with the system 200 of FIG. 2. A receiving device or system, such as system 300 of FIG. 3, may receive the compressed stream and be able to change what it has already stored or displayed. Updated information may also be stored locally, such as on a memory 220 of a device 220 or system 200 of FIG. 2. In this way, only minimal information may need to be transmitted while the receiver system is still able to reconstruct a good estimate of the original signal.

FIG. 8A shows a stream of real data 810 that may be modeled utilizing segmentation techniques in accordance with various embodiments. FIG. 8B show a first segmentation that includes a segment boundary points 820-*a* and 820-*b* along with segments 830-*a* and 830-*b*, which may be each described by a set of segment parameters $\theta_k$. In this example, segments 830 may be represented as steps or ramps. FIG. 8C shows a segmentation a later time. This segmentation includes an update on the segmentation shown in FIG. 8B. For example, segment 830-*b* of FIG. 8B has been deleted and replaced by segment 830-*c* of FIG. 8C. FIG. 8C shows additional segment boundary points 820-*c* and 820-*d* along with additional segments 830-*d* and 830-*e*. FIG. 8D shows a segmentation at an even later time. With this updated segmentation, some previous segment boundary points, such as 820-*d* have been deleted, while new segment boundary points 820-*e*, 8204, 820-*g*, and 820-*h* have been added. Segments 830-*d* and 830-*e* as seen in FIG. 8C have been deleted and replaced by segment 830-*f*. FIG. 8C also includes new segments 830-*g*, 830-*h*, 830-*i*, and 830-*j*. FIG. 8E then shows another updated segmentation. Again, some previous segment boundary points and/or segments have been deleted and/or changed in comparison to the previous segmentations, such as that shown in FIG. 8D. For example, segment boundary points 820-*g* and 820-*h* have been deleted, while segment boundary points 820-*i*, 820-*j*, and 820-*k* have been added. In addition, segment 830-*h*, 830-*i*, and 830-*j* have been canceled or revised in some way. The segmentation shown in FIG. 8E now includes segment 830-*k*, 830-*l*, 830-*m*, and 830-*n*.

FIG. 8F shows one example of a process 850 for using segmentation techniques in accordance with various embodiments to compress, transmit, and/or reconstruction a model of a signal. In particular, FIG. 8F shows in part a process of updating segmentation information that may be utilized to create segmentations as shown in FIGS. 8B-8E. In block 860, a segmentation of data samples from a signal may be stored. New data samples 865 may be provided that are then analyzed along with the information from the previously determined segmentation to determine updated possible segmentations 870.

At block 875, a segmentation with segment boundary points and segment parameters may be selected that may reflect the new data samples. This selection may be based on a most probably or maximum a posteriori analysis of the determined segmentations. At block 880, it may be determined whether the segmentation selected at block 875 is different from the previously determined segmentation that may be stored at block 860. If it is determined that a new segmentation that has been selected at block 875, a update command may be transmitted at block 885. This update command may include instructions that reflect the changes between the previously selected segmentation and the new updated segmentation. Information regarding the updated segmentation may also be provided and stored at block 860. On the receiver system side, it may be determined whether a new update command has been received at block 890. If new update information is received 891, this information may be provided to block 895 where it may be utilized to update the stored segmentation at the receiver 895. The updated segmentation information may be utilized to reconstruct a model of the signal 896.

The ability to use new data to update segment boundary points of the past when transmitting in real-time may be handled in different ways. If the segmentation changes, for example, a number of new segment boundary points and/or segment parameters may need to be transmitted and used in place of previously received segment boundary points and/or segment parameters at the receiver. This is reflected in FIGS. 8A-8F. In some cases, an estimate of the segment parameters that best describe the latest segment (that is, from the most recent segment boundary point to the current time) may also change when a new data point is measured. FIGS. 9A and 9B show a specific example of a change in segment parameters without changing the segment boundary points. After transmitting the most recent segment parameter estimates, the sending application can monitor these parameter estimates to determine whether they need to be transmitted again.

FIG. 9A shows a signal 910 that is being analyzed utilizing a segmentation technique in accordance with various embodiments. A first segment 930-*a* is determined along with a segment boundary point 920 that reflects a change in the data at the end of segment 930-*a*. The sample data is determined after segment boundary point 920 may be utilized as part of a segmentation technique that initially generates a set of segment parameters that are reflect in segment 930-*b*. As more time passes, however, new data samples may result in a different segment providing a better model of the signal 910. FIG. 9B shows this process. For example, FIG. 9C shows a segment 930-*c* with segment parameters that provides a better model of the signal 910. These segment parameters may be stored and/or transmitted, providing an update for the segmentation information. In some cases, several updates may be provided.

In some embodiments, different possible actions may occur when a new measurement is processed. In some cases, a new segmentation boundary point may be determined. This can occur when the new data begins to differ significantly from the model that describes the current (most recent) segment. The presence of a new segment boundary point and the segment parameters that describe the new segment can to be transmitted. In some cases, previously transmitted segment boundary points may need to be deleted. This can occur when a new measurement results in an entirely different segmentation being more likely than what has been previously transmitted. This is shown in several figures, including FIGS. 8B-8F. In this case, the receiving application can delete a number of previous segment boundary points. In some cases, new segment boundary points and segment parameters may be transmitted and/or stored. In some cases, segment parameters describing a current segment may have changed. For example, if the parameters describing the current segment drift significantly from those that were last transmitted, then they may need to be sent again. FIG. 9B show one such example.

In some embodiments, there may be different possible actions that may occur when one or more new data samples are processed utilizing a segmentation technique in accordance with various embodiments. The following provides an example where three possible actions may occur, though other actions may occur in some embodiments. These three possible actions may involve three possible commands that a transmitting device or system, such as system 200 of FIG. 2, may utilize to send commands to update the segmentation information that may be maintained by a receiver, such as system 300 of FIG. 3. In some cases, the transmitting system may utilize these commands to update the segmentation information that it stores locally on its own memory.

A first command may include a command to start a new segment; this may be equivalent to adding a new segment boundary point. The first command may include a command identifier, information regarding a new segment boundary point, which may include a start time for a new segment in some cases, and one or more segment parameters. A second command may include a command to delete a one or more previously transmitted or stored segments, which may include a command to delete one or more segment boundary points. In some cases, the second command may include a command identifier and information regarding a number of segment boundary points or specific segment boundary points to delete. In some cases, the second command may also include new segment parameters for a most recent segment. A third command may include information regarding updating a most recent segment. The third command may include a command identifier and one or more new segment parameters. These commands may be sent as packets in some cases. Some embodiments may include additional commands or instructions associate with the described commands. For example, commands may be given regarding noise variance information or multiple channel information.

Depending on the action required, zero, one, or multiple commands may need to be transmitted at a given time or situation. For example, should the segmentation change, the second command described above could be transmitted followed by one or more first commands. If the segment parameters drift too far from a previous transmission, the third command may need to be sent. In some cases, no commands may need to be transmitted when a new measurement is taken; for example, when the new data does not necessitate a new segment boundary point and/or new segment parameters. In this general situation, the receiving application can use the most recent segmentation, segment boundary points, and segment parameters to generate an estimate of the measurement.

In some cases, the number of commands transmitted (and thus, the efficiency of the segmentation technique) may be improved by delaying slightly the signal before transmitting it. By delaying the transmission, changes to segmentation may be caught before they cause unnecessary transmission of the first command and/or the second command described. Also, the more samples that are used to estimate the parameters of the current segment, the more accurately they describe the entire segment, and it is less likely they will need to be updated in the future.

Increasing the delay before transmission may reduce the number of commands that are ultimately transmitted. In some embodiments, the total amount of data transmitted asymptotes to the compression achievable by batch compression. At this limit, the first command described may be the only type of command transmitted.

Compressing a signal using the segmentation techniques in accordance with various embodiments can generate data to transmit at varying times. This is unlike much other data in the oilfield, for example, which generally occurs as a steady stream and utilizes constant bandwidth. Communications channels, including some satellite links, often provide a pay-per-kilobyte policy. In these networks, clients generally do not have a fixed bandwidth (although they may have an upper limit) and instead, time-division multiplexing may be used, for example, to dynamically allocate bandwidth between all users of the network as they need it. Embodiments that utilize segmentation techniques to compress data for transmission over these networks may provide an immediate and significant benefit.

Some communications channels provide a constant bandwidth and may be better suited to constant data streams. In these systems, however, segmentation techniques in accordance with various embodiments can still be used to compress data from multiple sources and an intelligent transmitter could multiplex between them, for example, dynamically allocating time to those channels that may need it.

In some embodiments, it is also possible to limit the bandwidth by adding latency or delay. Adding latency can be done by buffering the packets and transmitting them during the gaps (when the segmentation algorithm is not generating packets). In some embodiments, a transmitter may be limited to sending to a certain rate.

As discussed above, sample data may be segmented into different segments and each segment may be associated with a model particularly useful for modeling the data in that segment. In some embodiments, the data is modeled using either ramp or step functions, for example, using the least squares algorithm. These models may be evaluated using Bayesian Model Selection. Bayesian Model Selection is discussed in detail in Deviderjit Sivia and John Skilling, *Data Analysis: A Bayesian Tutorial* (OUP Oxford, 2ed. 2006), the entire contents of which is incorporated herein by reference. Thus, for each segment of each segmentation, a model that is either a ramp or a step can be assigned and the corresponding segmentations are assigned a weight indicative of how well the segmentation and associated models conform to the data stream as compared to other segmentations.

In some embodiments, sample data analysis may be provided by treating incoming data as being composed of segments between which include segment boundary points. The segment boundary points may be identified by the data analysis to provide for detection in changes in the signals determined by different sensors. In certain aspects, multiple sensors or the like may provide multiple data channels that may be segmented into segments and data fusion may be used to cross-correlate, compare, contrast or the like, segment boundary points in the incoming data to provide for compressed data representations of the signal data.

In one embodiment, the data may be analyzed in real-time to provide for real-time compression, rather than retrospective, compression of the data. In one embodiment, the data from one or more sensors may be fitted to an appropriate model and from analysis of the incoming data with regard to the model, segment boundary points may be identified. The model may be derived theoretically, from experimentation, from analysis of previous operations and/or the like. The models may process the data according to expected/modeled variances in the data, expected/modeled noise, expected/modeled response when other data changes occur and or the like. Using such a process, the threshold for when a boundary point is determined to have occurred may be set in the model.

As such, in one embodiment, data from one or more sensors may be analyzed with a segmentation technique. The segmentation technique may divide a heterogeneous signal, the signal being data from one or more sources associated with the hydrocarbon related process, into a sequence of segments. The discontinuities between segments may be referred to as segment boundary points.

Merely by way of example, one embodiment may include modeling the data in each segment as a linear model, such as a ramp or step, with additive Gaussian noise. Such models can be useful when the data has a linear relationship to the index. In alternative embodiments, more complex models may be employed, e.g., exponential, polynomial and trigonometric functions. As each new sample (set of data) is received, the algorithm outputs an updated estimate of the parameters of the underlying signal, e.g., the mean height of steps, the mean gradient of ramps and the mean offset of ramps, and additionally the parameters of the additive noise (for zero-mean Gaussian noise, the parameter is the standard deviation or the variance, but for more general noise distributions other parameters such as skewness or kurtosis may also be estimated).

In some embodiments, segment boundary points may be designated where the noise parameters are found to have changed. In some embodiments, the tails of a distribution are may be considered in the analysis, as when analyzing the risk of an event occurring the tails of the distribution may provide a better analytical tool than the mean of the distribution. In one embodiment, a probability may be determined as to whether that the height/gradient/offset of the sample is above/below a specific threshold.

A basic output of some systems, such as system 200 of FIG. 2, may be a collection of lists of segment boundary points and a probability for each list. The most probable list may be the most probable segmentation of the data according to the choice of models: $G_1, \ldots, G_j$.

Figure 10:
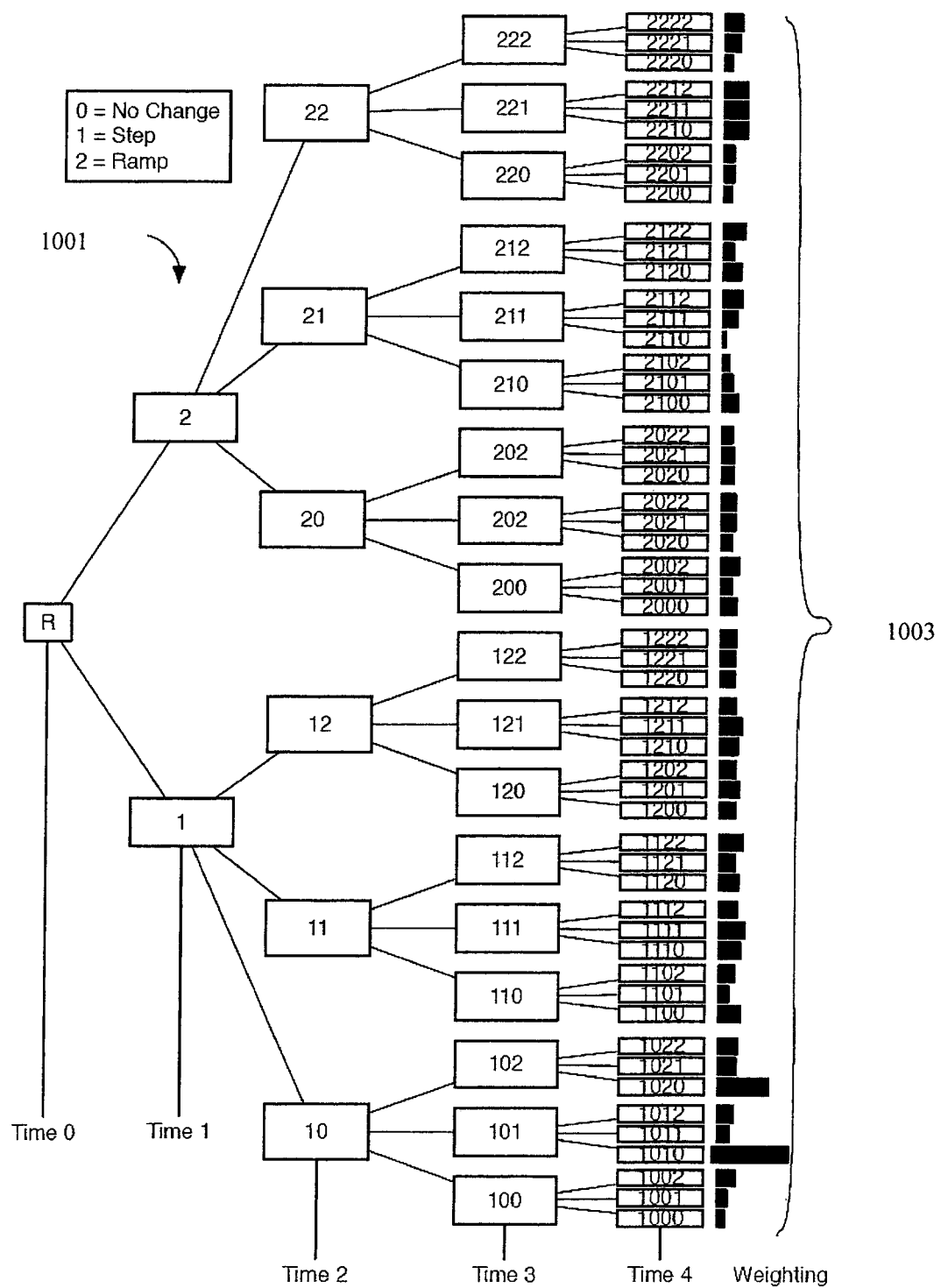
FIG. 10 provides a tree data structure utilized with a segmentation technique in accordance with various embodiments.

The segmentation of the signal in accordance with various embodiments may be described using a tree structure as shown in FIG. 10. A segmentation technique may be considered as a search of this tree. At time 0 (before any data has arrived) the tree consists of a single root node, R. At time 1 the root node spawns J leaves, one leaf for each of the J segment models—the first leaf represents the hypothesis that the first data point is modeled with $G_1$, the second leaf hypothesis is $G_2$, etc. At subsequent times, the tree may grow by each leaf node spawning J+1 leaves, one for each model and an extra one represented by 0, which indicates that the data point at the corresponding time belongs to the same model segment as its parent. For example, if $G_1$ were a step model and $G_2$ were a ramp, a path through the tree from the root to a leaf node at time 9 might be:

R 1 0 0 0 0 0 2 0 0 where this would indicate that the first six samples were generated by a step and that the remaining four samples were generated by a ramp.

Over time, the tree grows and it can be searched using a collection of particles each occupying a distinct leaf node. The number of particles may be chosen by the user/operator and around 20-100 may be sufficient, however other amounts of particles may be used in different aspects of the present invention. Associated with a particle is a weight, which can be interpreted as the probability that the segmentation indicated by the path from the particle to the root (as in the example above) is the correct segmentation. The objective of the segmentation technique may include concentrating the particles on leaves that mean the particle weights will be large.

Some embodiments may obtain a segmentation of data streams that may include segment boundary points. The segmentation process for determining segment boundary points and associated models, which may include segment parameters, may successively builds a tree data structure, an example of which is illustrated in FIG. 10, wherein each node in the tree represents different segmentations of the data. The tree can also be periodically pruned to discard low-probability segmentations, i.e., segmentations that have a poor fit to the data.

In a first step, the segmentations can initialized by establishing a root node R. Next a data point may be received from one or more input streams. In response the segmentation process can spawn child segmentations that may reflect different alternatives or models. In this example, three different alternatives are provided, namely, a continuation of the previous segment, a new segment with a first model, or a new segment with a second model. While this example provides two models, ramp and step, in alternative embodiments, additional models may be included. In one embodiment, the alternative models are ramp and step functions. As the root node does not represent any model, the first generation in the tree, reflecting the first data point, generally start a new segment which is either a ramp, which is represented in the tree as 1, or a step, which is represented in the tree as 2.

In the example given above, the particle R 1 0 0 0 0 0 2 0 0 can produce three new child nodes with corresponding particles:

R 1 0 0 0 0 0 2 0 0 0
R 1 0 0 0 0 0 2 0 0 1
R 1 0 0 0 0 0 2 0 0 2

The first of which indicates a continuation of the step segment that begins with the 7th data point, the second, a new ramp, and the third, a new step.

Models may then be created by fitting the data in the new segments to the designated models for the segments and models corresponding to existing segments are refit. For example, if a new ramp segment is to be created for a new child particle, the data in the segment can be fit to that ramp. When a new segment is created, the corresponding model that is assigned may merely be a function that puts the model value through the new data point. However, for existing segments in which the segment encompasses multiple data points, the model or segment parameters, e.g., the parameters defining the gradient and offset of a ramp, may be re-evaluated. Some form of linear regression technique may be used to determine the linear function to be used to model the data in the segment as a ramp or step.

The segmentations produced are next evaluated; this may involve different Bayesian analysis methods such as Bayesian Model Selection or the like to calculate weights indicative of how good a fit each segmentation is for the underlying data. In aspects of the present invention, the fitting of the segments may be based on knowledge of the data being processed and/or the knowledge of expected behavior of the data being processed.

After the segmentations, creation of model functions, and corresponding models have been evaluated, i.e., having had weights assigned thereto, the tree may be pruned by removing some particles from future consideration and to keep the particle population size manageable. The weights of the remaining particles may then be normalized.

Having evaluated the segmentations of the input data stream, the segmentations and corresponding models may be used to provided a compressed representation of the input data stream. The segmentation may be transmitted to a receiver system in some cases, where the segmentation may be utilized to reconstruct a model of the data stream. In some cases, the segmentation may be stored locally as a compressed form of the input data stream; the segmentation may be retrieved at a later point in time for different purposes.

Figure 11:
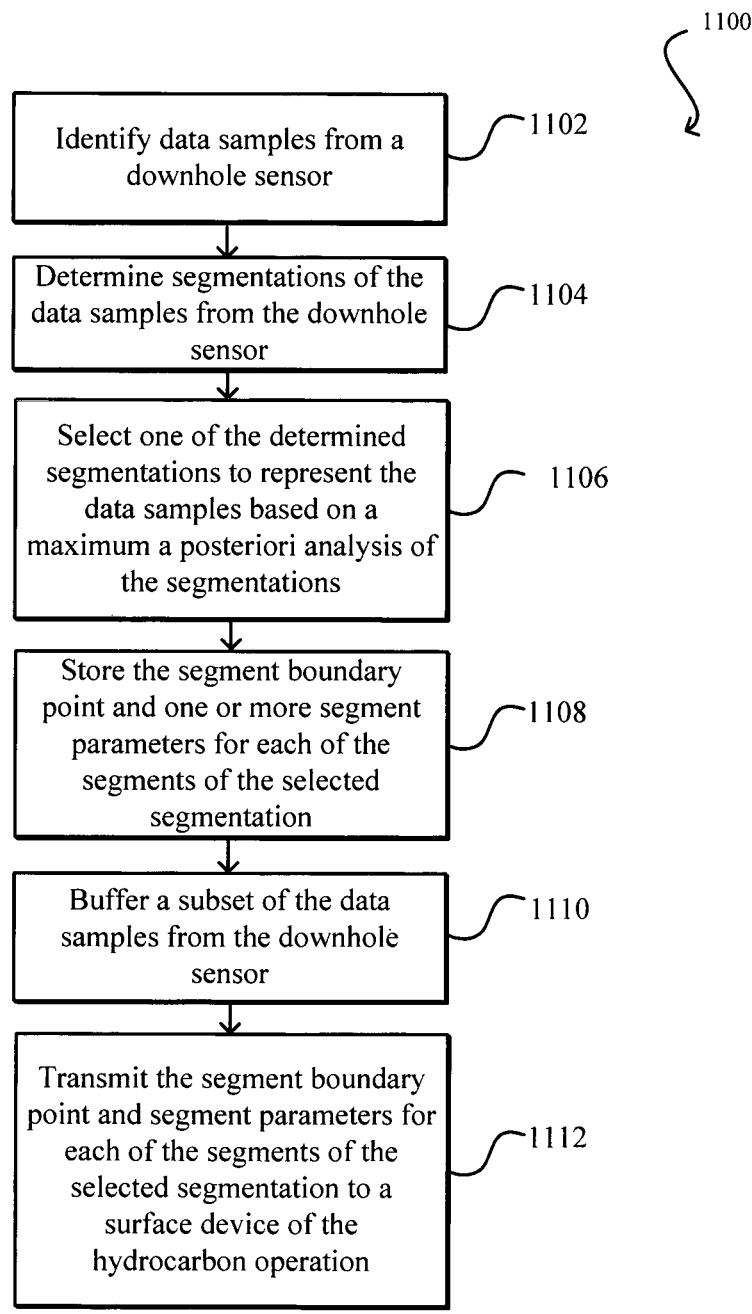
FIG. 11 provides a flow diagram for a method for compressing and transmitting field data from a downhole sensor of a hydrocarbon operation in accordance with various embodiments.

FIG. 11 provides a flow diagram illustrating a method 1100 of compressing and transmitting field data from a downhole sensor of a hydrocarbon operation in accordance with various embodiments. Method 1100 may be implemented utilize different systems and/or devices including, but not limited to, system 200 of FIG. 2. At step 1102, multiple data samples from the downhole sensor are identified. Multiple segmentations of the multiple data samples from the downhole sensor are determined at step 1104. Each segmentation may include one or more segments. Each segment may include a segment boundary point that may reflect a point in the data samples where a threshold has been exceeded with respect to the data samples of a previous segment or a point where the data samples begin. Each segment may also include one or more segment parameters that provide a linear representation of the data samples for the respective segment. At step 1106, one of the determined segmentations is selected to represent the multiple data samples based on a maximum a posteriori analysis of the determined segmentations. The segment boundary point and one or more segment parameters for each of the one or more segments of the selected segmentation are stored at block 1108. A subset of the multiple data samples from the downhole sensor may be buffered at step 1110. The segment boundary point and one, or more segment parameters for each of the one or more segments of the selected segmentation are transmitted to a surface device of the hydrocarbon operation at step 1112.

In some embodiments, method 1100 may further include identifying additional data samples from the downhole sensor. Multiple updated segmentations of the multiple data samples and the additional data samples into one or more segments may be determined. One of the determined updated segmentations may be selected to represent the multiple data samples and additional data samples based on a maximum a posteriori analysis of the determined updated plurality of segmentations. Difference information between the determined segmentation of the multiple data samples and the updated segmentation of the multiple data samples and the additional data samples may be determined. The difference information may include information such as adding a new segment boundary point, deleting a stored segment boundary point, and/or revising one or more stored segment parameters of one or more segment. The stored segment boundary point and one or more segment parameters for each of the one or more segments of the determined segmentation based on the determined difference information may be updated.

Figure 12:
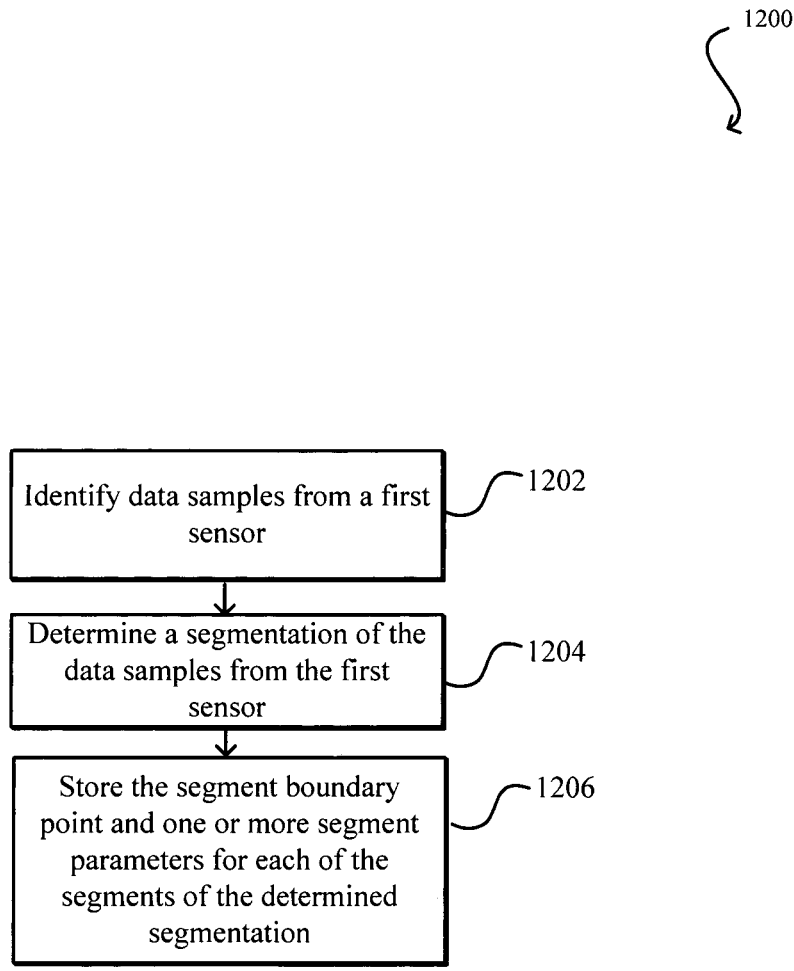
FIG. 12 provides a flow diagram for a method for compressing sensor data in accordance with various embodiments.

FIG. 12 provides a flow diagram illustrating a method 1200 of compressing sensor data in accordance with various embodiments. Method 1200 may be implemented utilize different systems and/or devices including, but not limited to, system 200 of FIG. 2. At step 1202, multiple data samples from a first sensor are identified. A segmentation of the multiple data samples from the first sensor are determined at step 1204. The determined segmentation may includes multiple segments of varying sizes. Each segment of the determined segmentation may include one or more segment parameters that provide a representation of the data samples for the respective segment. Each segment may also include a segment boundary point that indicates a point in the data samples where a threshold has been exceeded for the data samples with respect to the one or more segment parameters of a previous segment. At step 1206, the segment boundary point and one or more segment parameters for each of the one or more segments of the determined segmentation are stored.

In some embodiments, method 1200 may also include determining multiple segmentations of the data samples from the first sensor. One of the segmentations may be selected based on a most probable segmentation analysis of multiple segmentations. The selected segmentation may be utilized as the determined segmentation of step 1204.

The threshold of step 1204 may depend upon at least a transmission bandwidth constraint or a storage constraint. The one or more segment parameters of a respective segment may provide a linear model of the respective segment in some cases. The linear model of a respective segment may include a gradient and/or an axis intercept. The linear model of a respective segment may include a step function and/or a ramp function. The or more segment parameters of a respective segment may provide a non-linear model of the respective segment in some cases.

Some embodiments of method 1200 may further include transmitting the segment boundary point and one or more segment parameters for each of the one or more segments of the determined segmentation. Transmitting the segment boundary point and one or more segment parameters for each of the one or more segments of the determined segmentation may occur at a rate less than 3 kilobits per second, at a rate less than 1 kilobits per second, and/or at a rate less than 100 bits per second in some cases. Transmitting the segment boundary point and one or more segment parameters for each of the one or more segments of the determined segmentation may occur dynamically based on a bandwidth constraint. In some cases, transmitting the segment boundary point and one or more segment parameters for each of the one or more segments of the determined segmentation may include delaying the transmission based on bandwidth considerations.

In some embodiments, a noise variance for each segment of the determined segmentation may be determined. The noise variance for each segment of the determined segmentation may be stored and transmitted.

Some embodiments may further include identifying additional data samples from the first sensor. An updated segmentation of the multiple data samples and the additional data samples may be determined. Difference information between the determined segmentation of the data samples and the updated segmentation of the data samples and the additional data samples may be determined. The difference information between the determined segmentation of the data samples and the updated segmentation of the data samples and the additional data sample may be stored. In some cases, difference information may be transmitted. For example, the difference information may be transmitted from a downhole device and/or system to a surface device and/or system. The difference information may include adding one or more new segment boundary points, adding one or more new segment parameters, deleting one or more stored segment boundary point, and/or revising one or more stored segment parameters of one or more segments.

Method 1200 may also include identifying data samples from a second sensor. A segmentation of the data samples of the second sensor into one or more segments may be determined. Each segment of the segmentation may includes the segment boundary point from the determined segmentation of the data samples of the first sensor. Each segment may also include one or more segment parameters that provide a representation of the data samples of the second sensor for the respective segment. The one or more segment parameters for each of the one or more segments of the determined segmentation of the data samples of the second sensor may be stored, and in some cases the segment boundary point and one or more segment parameters for each of the one or more segments of the determined segmentation of the data samples of the first sensor and the second sensor may be transmitted. In some embodiments, one or more segment parameters that provide a representation of the data samples of the second sensor for a respective segment are determined with respect to the segment parameters that provide a representation of the data samples of the first sensor for a respective segment.

Figure 13:
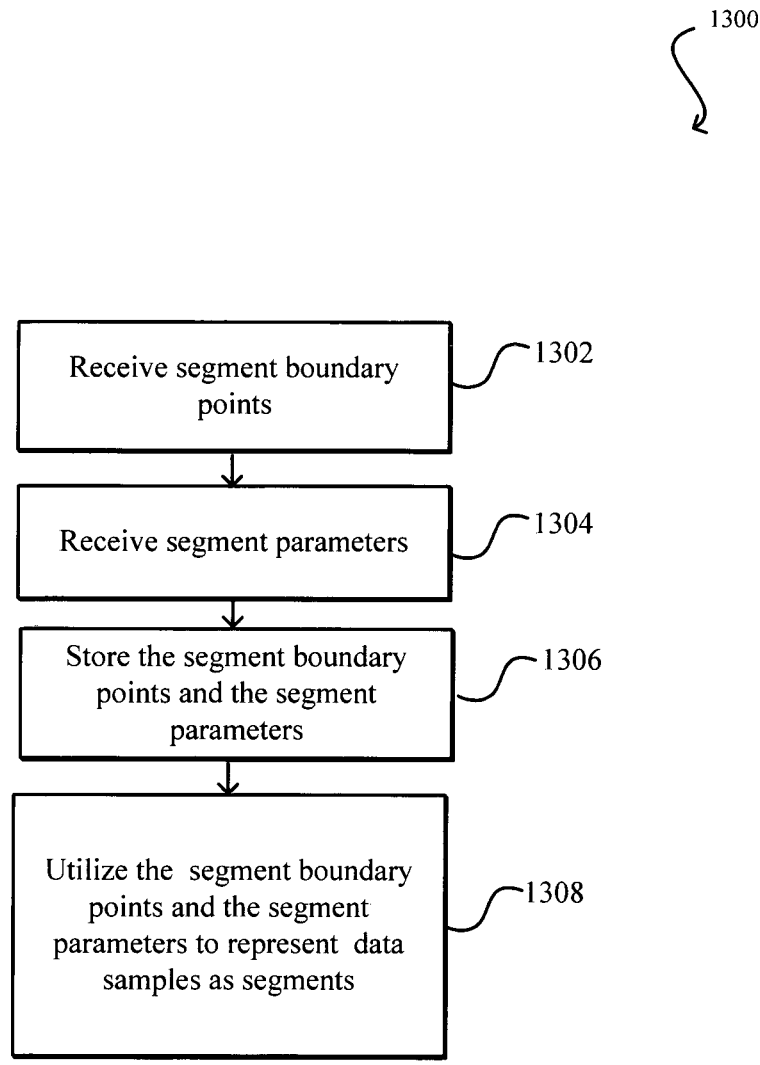
FIG. 13 provides a flow diagram for a method for receiving compressed sensor data representing data from a sensor in accordance with various embodiments.

FIG. 13 provides a flow diagram illustrating a method 1300 of receiving compressed sensor data representing data from a sensor in accordance with various embodiments. Method 1300 may be implemented utilize different systems and/or devices including, but not limited to, system 200 of FIG. 2 and/or system 300 of FIG. 3. Method 1300 includes receiving multiple segment boundary points at step 1302. Each segment boundary point may indicate a point in the data where a threshold has been exceeded for the data. Multiple segment parameters may be received. Each of the respective segment parameters may be linked with a respective segment boundary point. Each of the one or more segment parameters may provide information regarding a representation of the data samples for the respective segment. At step 1304, the segment boundary points and the segment parameters are stored. The segment boundary points and the segment parameters are utilized to represent a plurality of data samples as multiple segments at step 1306.

Method 1300 may also include receiving one or more additional segment boundary points and/or one or more additional segment parameters. The segments may be updated utilizing the one or more additional segment boundary point and/or one or more additional segment parameters. In some cases, one or more segment updating instructions may be received. The segment updating instructions may include instructions to delete at least one of the segment boundary points or one of the segment parameters. The segment updating instructions may include instructions to change at least one of the segment boundary points or one of the segment parameters.

In some cases, the segments may be presented in an electronic display. The one or more segment parameters of a respective segment may provide a linear model of the respective segment. The linear model of respective segment may include at least a gradient or an axis intercept. The linear model of a respective segment may include at least a step function or a ramp function. In some cases, segment parameters of a respective segment may provide a non-linear model of the respective segment.

In some cases, the segment boundary points and the segment parameters may be received at different rates, such as at a rate less than 3 kilobits per second, at a rate less than 1 kilobits per second, or at a rate less than 100 bits per second, for example. The rate may be determined dynamically based on a bandwidth constraint. Some embodiments may also include receiving noise variances. Each respective noise variance may be associated with a respective segment.

Figure 14:
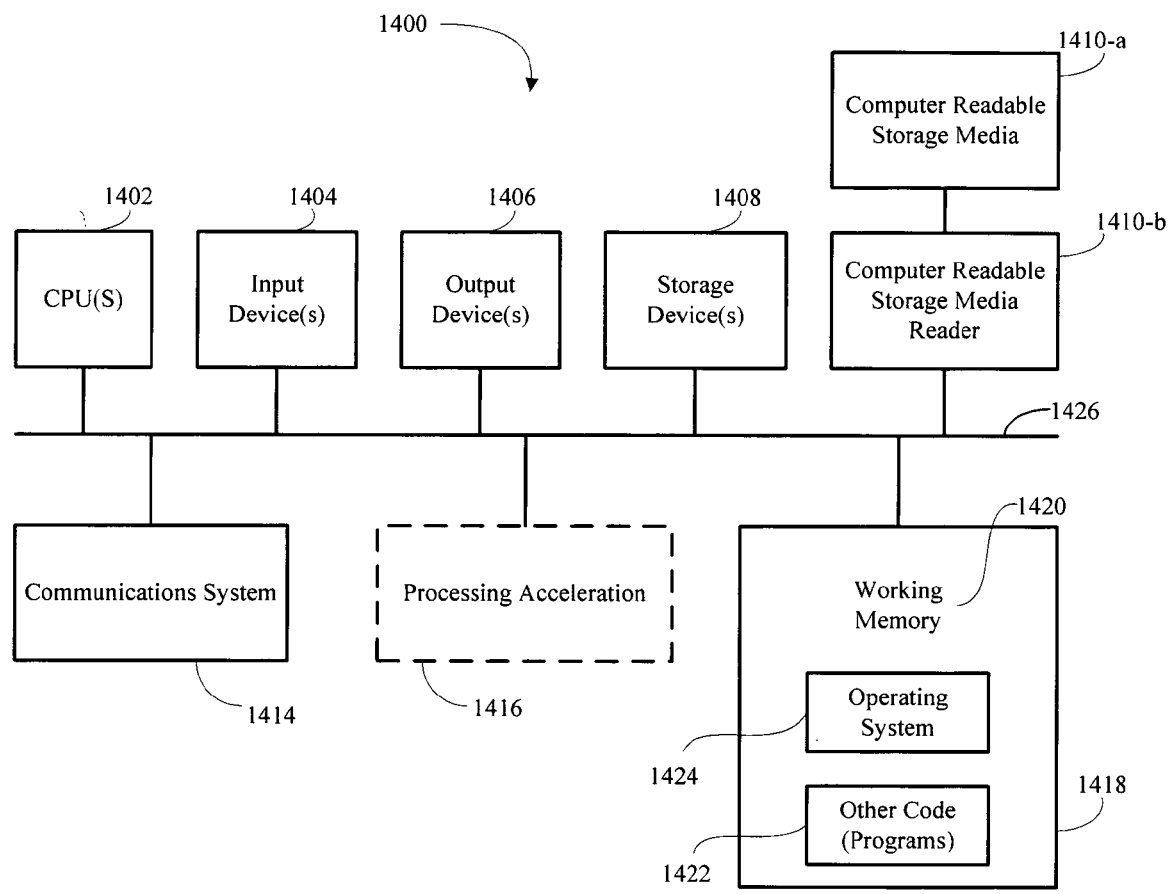
FIG. 14 provides a schematic diagram illustrating a computer system in accordance with various embodiments.

The methods and systems described in connection with method 1100, 1200, and/or 1300 and systems 10, 200, and/or 300 may be implemented in part by using a computer system 1400 such as shown schematically in FIG. 14, which broadly illustrates how individual system elements may be implemented in a separated or more integrated manner. The system 1400 is shown comprised of hardware elements that may be electrically coupled via bus 1426. The hardware elements may include one or more processors 1402, one or more input devices 1404, one or more output devices 1406, one or more storage devices 1408, a computer-readable storage media reader 1410a, a communications system 1414, a processing acceleration unit 1416 such as a DSP or special-purpose processor, and a memory 1418. The computer-readable storage media reader 1410a may be further connected to a computer-readable storage medium 1410b, the combination comprehensively representing remote, local, fixed, and/or removable storage devices plus storage media for temporarily and/or more permanently containing computer-readable information. The communications system 1414 may comprise a wired, wireless, modem, and/or other type of interfacing connection and permits data to be collected from one or more sensors. In some instances, such data collection may be performed in real time by the communications system in determining a segmentation model of data samples from the sensors.

The system 1400 may also include software elements, shown as being currently located within working memory 1420, which may include an operating system 1424 and other code 1422, such as a program designed to implement methods of different embodiments. Merely by way of example, system 1400 may be utilized to implement method 1100 of FIG. 11, method 1200 of FIG. 12, and/or method 1300 of FIG. 13. In addition, system 10 of FIG. 1, system 200 of FIG. 2, and/or system 300 of FIG. 3 may utilize aspects of system 1400. It will be apparent to those skilled in the art that substantial variations may be used in accordance with specific requirements. For example, customized hardware might also be used and/or particular elements might be implemented in hardware, software (including portable software, such as applets), or both. Further, connection to other computing devices such as network input/output devices may be employed.

Circuits, logic modules, blocks, processors, and/or other components may be described herein as being "configured" to perform various operations. Those skilled in the art will recognize that, depending on implementation, such configuration can be accomplished through design, setup, interconnection, and/or programming of the particular components and that, again depending on implementation, a configured component might or might not be reconfigurable for a different operation. For example, a programmable processor can be configured by providing suitable executable code; a dedicated logic circuit can be configured by suitably connecting logic gates and other circuit elements; and so on.

While the embodiments described above may make reference to specific hardware and software components, those skilled in the art will appreciate that different combinations of hardware and/or software components may also be used and that particular operations described as being implemented in hardware might also be implemented in software or vice versa.

Computer programs incorporating various features of different embodiments may be encoded on various computer readable storage media; suitable media include magnetic disk or tape, optical storage media such as compact disk (CD) or digital versatile disk (DVD), flash memory, and the like. Computer-readable storage media encoded with the program code may be packaged with a compatible device or provided separately from other devices. In addition program code may be encoded and transmitted via wired optical, and/or wireless networks conforming to a variety of protocols, including the Internet, thereby allowing distribution, e.g., via Internet download.

The previous description provides exemplary embodiments only, and is not intended to limit the scope, applicability, or configuration of the disclosure. Rather, the previous description of the exemplary embodiments will provide those skilled in the art with an enabling description for implementing one or more exemplary embodiments. It is understood that various changes may be made in the function and arrangement of elements without departing from the scope of the invention. Several embodiments were described herein, and while various features are ascribed to different embodiments, it should be appreciated that the features described with respect to one embodiment may be incorporated within other embodiments as well. By the same token, however, no single feature or features of any described embodiment should be considered essential to every embodiment of the invention, as other embodiments of the invention may omit such features.

Specific details are given in the previous description to provide a thorough understanding of the embodiments. However, it will be understood by one of ordinary skill in the art that the embodiments may be practiced without these specific details. For example, circuits, systems, networks, processes, and other elements in the invention may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram; or a block diagram. Although a flowchart may describe the operations as a sequential process, many of the operations can be performed in parallel or concurrently. In addition, the order of the operations may be re-arranged. A process may be terminated when its operations are completed, but could have also included additional steps or operations not discussed or included in a figure. Furthermore, not all operations in any particularly described process may occur in all embodiments. A process may correspond to a method, a function, a procedure, a subroutine, a subprogram, etc. When a process corresponds to a function, its termination corresponds to a return of the function to the calling function or the main function.

Furthermore, embodiments of the invention may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

While detailed descriptions of one or more embodiments have been give above, various alternatives, modifications, and equivalents will be apparent to those skilled in the art without varying from the spirit of the invention. Moreover, except where clearly inappropriate or otherwise expressly noted, it should be assumed that the features, devices, and/or components of different embodiments may be substituted and/or combined. Thus, the above description should not be taken as limiting the scope of the invention, which is defined by the appended claims.

What is claimed is:

1. A method of compressing sensor data comprising:
   using a first sensor to detect a property of the first sensor's physical environment and to convert the detected property into data samples;
   identifying a plurality of the data samples from the first sensor;
   determining a segmentation of the plurality of data samples from the first sensor, wherein the determined segmentation comprises:
   a plurality of segments of varying sizes and each segment of the determined segmentation includes:
      one or more segment parameters describing a model of the data samples in the respective segment; and
      a segment boundary point indicating a boundary between the respective segment and a preceding segment in the plurality of segments, and wherein the segment boundary point is determined from a change beyond a determined threshold between the one or more segment parameters in the preceding segment and the one or more segment parameters in the respective segment; and
   storing the segment boundary point and one or more segment parameters for each of the one or more segments of the determined segmentation.

2. The method of compressing sensor data of claim 1 further comprising:
   determining a plurality of segmentations of the plurality of data samples from the first sensor;
   selecting one of the plurality of segmentations based on a most probable segmentation analysis of the plurality of segmentations; and
   utilizing the selected segmentation as the determined segmentation of the plurality of data samples from the first sensor.

3. The method of compressing sensor data of claim 1 wherein the determined segmentation is determined from at least a transmission bandwidth constraint or a storage constraint.

4. The method of compressing sensor data of claim 1 wherein the one or more segment parameters of a respective segment provide a linear model of the data samples in the respective segment.

5. The method of compressing sensor data of claim 4 wherein the one or more segment parameters comprise at least one of a gradient or an axis intercept of the linear model.

6. The method of compressing sensor data of claim 4 wherein the linear model comprises at least one of a step function or a ramp function.

7. The method of compressing sensor data of claim 1 wherein the one or more segment parameters describe a non-linear model of the data samples in the respective segment.

8. The method of compressing sensor data of claim 1 further comprising:
   transmitting the segment boundary point and one or more segment parameters for each of the plurality of segments of the determined segmentation.

9. The method of compressing sensor data of claim 8 wherein transmitting the segment boundary point and one or more segment parameters for each of the plurality of segments of the determined segmentation occurs at a rate less than 3 kilobits per second.

10. The method of compressing sensor data of claim 8 wherein transmitting the segment boundary point and one or more segment parameters for each of the plurality of segments of the determined segmentation occurs at a rate less than 1 kilobits per second.

11. The method of compressing sensor data of claim 8 wherein transmitting the segment boundary point and one or more segment parameters for each of the plurality of segments of the determined segmentation occurs at a rate less than 100 bits per second.

12. The method of compressing sensor data of claim 8 wherein transmitting the segment boundary point and one or more segment parameters for each of the plurality of segments of the determined segmentation occurs dynamically based on a bandwidth constraint.

13. The method of compressing sensor data of claim 1 further comprising:
determining a noise variance for each segment of the determined segmentation;
storing the noise variance for each segment of the determined segmentation; and
transmitting the noise variance for each segment of the determined segmentation.

14. The method of compressing sensor data of claim 1 further comprising:
identifying additional data samples from the first sensor;
determining an updated segmentation of the plurality of data samples and the additional data samples;
determining difference information between the determined segmentation of the plurality of data samples and the updated segmentation of the plurality of data samples and the additional data samples; and
storing the difference information between the determined segmentation of the plurality of data samples and the updated segmentation of the plurality of data samples and the additional data sample.

15. The method of compressing sensor data of claim 14 further comprising:
transmitting the difference information.

16. The method of compressing sensor data of claim 14 wherein the difference information includes at least adding one or more new segment boundary points, adding one or more new segment parameters, deleting one or more stored segment boundary point, or revising one or more stored segment parameter of one or more segments in the plurality of segments.

17. The method of compressing sensor data of claim 8 wherein transmitting the segment boundary point and one or more segment parameters for each of the one or more segments of the determined segmentation further comprises delaying the transmission based on bandwidth considerations.

18. The method of compressing sensor data of claim 1 further comprising:
identifying a plurality of data samples from a second sensor;
determining a segmentation of the plurality of data samples of the second sensor into one or more segments, wherein each segment of the segmentation includes:
the segment boundary point from the determined segmentation of the plurality of data samples of the first sensor; and
one or more segment parameters describing a model of the data samples from the second sensor in the respective segment; and
storing the one or more segment parameters for each of the plurality of segments of the determined segmentation of the data samples of the second sensor.

19. The method of compressing sensor data of claim 18 further comprising:
transmitting the segment boundary point and one or more segment parameters for each of the one or more segments of the determined segmentation of the data samples of the first sensor and the second sensor.

20. The method of compressing sensor data of claim 18 wherein the one or more segment parameters that describe the model of the data samples from the second sensor for a respective segment are determined with respect to the segment parameters that describe the model of the data samples of the first sensor for a respective segment.

21. A sensor system for providing compressed sensor data, the system comprising:
one or more sensors configured to measure a property of an environment in which the one or more sensors are disposed and convert the measured property into data;
a processor in communication with the one or more sensors; and
a memory device including processor-executable instructions that, when executed by the processor, cause the processor to:
identify plurality of data samples from one of the sensors;
determine a segmentation of the plurality of data samples from one of the sensors, wherein the determined segmentation includes a plurality of segments of varying sizes, each segment of the determined segmentation including:
one or more segment parameters that describe a model of the data samples for the respective segment; and
a segment boundary point that indicates a point in the plurality of data samples where a threshold difference between the one or more parameters describing the model of the respective segment and the one or more parameters describing a model of the preceding segment in the plurality of segments has been exceeded; and
store the segment boundary point and one or more segment parameters for each of the one or more segments of the determined segmentation.

22. The sensor system for providing compressed sensor data of claim 21 wherein the processor-executable instructions further comprise instructions to cause the processor to:
determine a plurality of segmentations of the plurality of data samples from the first sensor;
select one of the plurality of segmentations based on a most probable segmentation analysis of the plurality of segmentations; and
utilize the selected segmentation as the determined segmentation of the plurality of data samples from the first sensor.

23. The sensor system for providing compressed sensor data of claim 21 wherein the threshold depends upon at least a transmission bandwidth constraint or a storage constraint.

24. The sensor system for providing compressed sensor data of claim 21 wherein the one or more segment parameters of a respective segment describe a linear model of the data samples in the respective segment.

25. The sensor system for providing compressed sensor data of claim 24 wherein the one or more segment parameters comprise at least a gradient or an axis intercept.

26. The sensor system for providing compressed sensor data of claim 24 wherein the linear model comprises at least one of a step function or a ramp function.

27. The sensor system for providing compressed sensor data of claim 21 wherein the one or more segment parameters of a respective segment describe a non-linear model of the respective segment.

28. The sensor system for providing compressed sensor data of claim 21 wherein the processor-executable instructions further comprise instructions to cause the processor to:
transmit the segment boundary point and the one or more segment parameters for each of the plurality of segments of the determined segmentation.

29. The sensor system for providing compressed sensor data of claim 28 wherein transmitting the segment boundary point and one or more segment parameters for each of the one or more segments of the determined segmentation occurs at a rate less than 3 kilobits per second.

30. The sensor system for providing compressed sensor data of claim 28 wherein transmitting the segment boundary point and one or more segment parameters for each of the plurality of segments of the determined segmentation occurs at a rate less than 1 kilobits per second.

31. The sensor system for providing compressed sensor data of claim 28 wherein transmitting the segment boundary point and one or more segment parameters for each of the plurality of segments of the determined segmentation occurs at a rate less than 100 bits per second.

32. The sensor system for providing compressed sensor data of claim 28 wherein transmitting the segment boundary point and one or more segment parameters for each of the plurality of segments of the determined segmentation occurs dynamically based on a bandwidth constraint.

33. The sensor system for providing compressed sensor data of claim 21 wherein the processor-executable instructions further comprise instructions to cause the processor to:
   determine a noise variance for each segment of the determined segmentation;
   store the noise variance for each segment of the determined segmentation; and
   transmit the noise variance for each segment of the determined segmentation.

34. The sensor system for providing compressed sensor data of claim 21 wherein the processor-executable instructions further comprise instructions to cause the processor to:
   identify additional data samples from the first sensor;
   determine an updated segmentation of the plurality of data samples and the additional data samples;
   determine difference information between the determined segmentation of the plurality of data samples and the updated segmentation of the plurality of data samples and the additional data samples; and
   store the difference information between the determined segmentation of the plurality of data samples and the updated segmentation of the plurality of data samples and the additional data sample.

35. The sensor system for providing compressed sensor data of claim 34 wherein the processor-executable instructions further comprise instructions to cause the processor to:
   transmit the difference information.

36. The sensor system for providing compressed sensor data of claim 34 wherein the difference information includes at least adding one or more new segment boundary points, adding one or more new segment parameters, deleting one or more stored segment boundary point, or revising one or more stored segment parameters of one or more segments.

37. The sensor system for providing compressed sensor data of claim 28 wherein transmitting the segment boundary point and one or more segment parameters for each of the one or more segments of the determined segmentation further comprises delaying the transmission based on bandwidth considerations.

* * * * *